US011946672B2

(12) United States Patent
Jaffrey

(10) Patent No.: US 11,946,672 B2
(45) Date of Patent: Apr. 2, 2024

(54) ENERGY RECOVERY FROM WASTE HEAT

(71) Applicant: Breakthrough Technologies, LLC, Boston, MA (US)

(72) Inventor: Kamal Jaffrey, Winchester, MA (US)

(73) Assignee: Breakthrough Technologies, LLC, Boston, MA (US)

( * ) Notice: Subject to any disclaimer, the term of this patent is extended or adjusted under 35 U.S.C. 154(b) by 78 days.

(21) Appl. No.: 15/734,738

(22) PCT Filed: May 29, 2019

(86) PCT No.: PCT/US2019/034246
§ 371 (c)(1),
(2) Date: Dec. 3, 2020

(87) PCT Pub. No.: WO2019/236340
PCT Pub. Date: Dec. 12, 2019

(65) Prior Publication Data
US 2021/0262706 A1  Aug. 26, 2021

Related U.S. Application Data

(60) Provisional application No. 62/767,641, filed on Nov. 15, 2018, provisional application No. 62/680,038, filed on Jun. 4, 2018.

(51) Int. Cl.
F25B 21/02 (2006.01)
F25B 25/00 (2006.01)
H10N 10/17 (2023.01)

(52) U.S. Cl.
CPC .............. F25B 21/02 (2013.01); F25B 25/00 (2013.01); H10N 10/17 (2023.02);
(Continued)

(58) Field of Classification Search
CPC .. H01L 35/32; F25B 2700/2107; F25B 25/00; F25B 21/02; F25B 2321/0212
See application file for complete search history.

(56) References Cited

U.S. PATENT DOCUMENTS 7,709,766 B2 * 5/2010 Gambino ................. C23C 4/18
219/121.69
7,926,293 B2 * 4/2011 Bell ........................ F02G 1/043
62/3.2

(Continued)

FOREIGN PATENT DOCUMENTS

EP      3121060 A1 *  1/2017  ............... B60H 1/00
WO   2019236340 A1   12/2019

OTHER PUBLICATIONS

PCT Search Report and Written Opinion issued in connection with corresponding PCT Application No. PCT/US19/34246 dated Dec. 12, 2019.

(Continued)

Primary Examiner — Filip Zec
(74) Attorney, Agent, or Firm — Mintz, Levin, Cohn, Ferris, Glovsky and Popeo, P.C.

(57) ABSTRACT

An apparatus for waste heat recovery is provided. The apparatus includes a base block disposed adjacent to a heat source, a thermoelectric generator including a first end and a second end, the first end being thermally coupled to the base block and configured to receive heat from the heat source, and a thermoelectric cooler including a third end and a fourth end, the third end being thermally coupled to the second end. The thermoelectric cooler is configured to receive an electric current, which causes the third end to cool and the fourth end to heat such that the third end conducts heat from the second end. Related apparatus, systems, techniques, and articles are also described.

16 Claims, 25 Drawing Sheets

(52) U.S. Cl.
CPC . *F25B 2321/0212* (2013.01); *F25B 2321/023* (2013.01); *F25B 2339/047* (2013.01); *F25B 2700/2107* (2013.01)

(56) References Cited

U.S. PATENT DOCUMENTS

| | | | | |
|---|---|---|---|---|
| 8,169,045 | B2* | 5/2012 | Dibra | H10N 10/17 |
| | | | | 438/54 |
| 8,656,710 | B2* | 2/2014 | Bell | F28D 7/106 |
| | | | | 60/275 |
| 9,293,680 | B2* | 3/2016 | Poliquin | H01M 14/00 |
| 9,455,390 | B2* | 9/2016 | Kurihara | H10N 10/852 |
| 9,731,218 | B2* | 8/2017 | Waite | C02F 9/005 |
| 2005/0269254 | A1* | 12/2005 | Roitman | B01J 43/00 |
| | | | | 210/252 |
| 2009/0000310 | A1* | 1/2009 | Bell | B60H 1/00271 |
| | | | | 62/3.7 |
| 2012/0204577 | A1 | 8/2012 | Ludwig | |
| 2013/0005372 | A1 | 1/2013 | Strei et al. | |
| 2013/0220905 | A1* | 8/2013 | Waite | C02F 1/008 |
| | | | | 62/3.4 |
| 2017/0167120 | A1 | 6/2017 | Sarikaya | |
| 2017/0309545 | A1* | 10/2017 | Hiller | H10N 10/01 |
| 2018/0321094 | A1* | 11/2018 | Jang | G01K 7/015 |
| 2020/0248913 | A1* | 8/2020 | Al-Amri | H02S 40/42 |

OTHER PUBLICATIONS

Teffah et al., "Modeling and Experimentation of New Thermoelectric Cooler-Thermoelectric Generator Module", Energies, Mar. 7, 2018, 11(3):11 pages.

Alhammad et al. (2016) "Current Control to Improve COP of Thermoelectric Generator and Cooler for PV Panel Cooling", IEEE, pp. 53-58.

Hsu et al. (2013) "A Case Study of Thermoelectric Generator Application on Rotary Cement Furnace", IEEE, 78-81 pages.

\* cited by examiner

Related Art

ENERGY RECOVERY FROM WASTE HEAT

CROSS-REFERENCE TO RELATED APPLICATIONS

This application is a national stage application filed under 35 U.S.C. 371, of International Patent Application No. PCT/US19/34246 filed May 29, 2019, which claims priority to U.S. Provisional Application No. 62/680,038, filed on Jun. 4, 2018 and U.S. Provisional Application No. 62/767,641, filed on Nov. 15, 2018, the disclosures of each of which are hereby expressly incorporated herein by reference in their entirety.

TECHNICAL FIELD

The current subject matter is generally related to thermal management systems.

BACKGROUND

Heat removal systems remove unwanted heat from heat sources to ensure that components remain at appropriate operating temperatures. There are a number of different types of cooling solutions that are typically employed, however the majority of them have a cooling unit and some form of heat rejection system. The cooling unit provides refrigeration to the heat source, typically by transferring heat from air in the heat source to a fluid that flows through the cooling unit. The heat rejection systems can vary, however they generally serve the purpose of rejecting heat from the fluid that flows through the cooling unit.

In some cases, the heat is rejected to outside ambient air. Therefore, there is a significant amount of energy that is vented as waste heat. Additionally, the efficiency of the system is highly dependent on the temperature of the ambient air.

SUMMARY

In an aspect, an apparatus includes a body, at least one thermoelectric generator (TEG) and at least one thermoelectric cooler (TEC). The body is configured to receive heat from a fluid. The at least one thermoelectric generator (TEG) includes a first end and a second end, the first end of the at least one TEG being thermally coupled to the body and configured to receive at least a portion of the heat from the fluid. The at least one thermoelectric cooler (TEC) includes a first end and a second end, the second end of the at least one TEC being thermally coupled to the second end of the at least one TEG, the at least one TEC being configured to receive electric power, which causes the first end of the at least one TEC to heat and the second end of the at least one TEC to cool such that the second end of the at least one TEC extracts heat from the second end of the at least one TEG.

One or more of the following features can be included in any feasible combination. For example, the system can include at least one thermally conductive member. The at least one TEG can be thermally coupled to a first side of the thermally conductive member, and the at least one TEC can be thermally coupled to a second side of the thermally conductive member. The at least one TEG can be positioned between and coupled to the body and the at least one thermally conductive member. The system can include at least one temperature sensor. The at least one temperature sensor can be positioned adjacent to one of the first end and the second end of the at least one TEG, the at least one temperature sensor being configured to measure a temperature of condenser at the position adjacent to one of the first end and the second end of the at least one TEG. The at least one temperature sensor can be positioned adjacent to one of the first end and the second end of the at least one TEC, and configured to measure a temperature of condenser at the position adjacent to one of the first end and the second end of the at least one TEC. The at least one temperature sensor can be embedded within the body.

In another aspect, an apparatus includes first, second, and third thermally conductive members; a first thermoelectric cooler (TEC), a second thermoelectric color, a first body, a second body, a first thermoelectric generator (TEG), and a second thermoelectric generator. The first thermoelectric cooler (TEC) is positioned between, and coupled to, the first and second thermally conductive members, the first TEC being configured to remove heat from the first thermally conductive member, and to deliver heat to the second thermally conductive member. The second TEC is positioned between, and coupled to, the second and third thermally conductive members, the second TEC being configured to remove heat from the third thermally conductive member, and to deliver heat to the second thermally conductive member. The first body includes a first passage extending therethrough, the first passage being configured to receive a fluid, and the first body being configured to receive heat from the fluid. The second body includes a second passage extending therethrough, the second passage being configured to receive the fluid from the first passage, and the body being configured to receive heat from the fluid. The first thermoelectric generator (TEG) is positioned between the first thermally conductive member and the first body, the first TEG being configured to receive heat transferred to the first body from the fluid. The second TEG is positioned between the third thermally conductive member and the second body, the second TEG being configured to receive heat transferred to the second body from the fluid.

In yet another aspect, a system includes a condenser including a body, at least one thermoelectric generator (TEG) and at least one thermoelectric cooler (TEC). The body is configured to receive heat from a fluid. The at least one thermoelectric generator (TEG) includes a first end and a second end, the first end being thermally coupled to the body and configured to receive at least a portion of the heat from the fluid thereby causing the at least one TEG to generate a first electric power. The at least one thermoelectric cooler (TEC) includes a first end and a second end, the second end of the at least one TEC being thermally coupled to the second end of the at least one TEG, the at least one TEC being configured to receive a second electric power which causes the first end of the at least one TEC to heat and the second end of the at least one TEC to cool such that the second end of the at least one TEC extracts heat from the second end of the at least one TEG.

One or more of the following features can be included in any feasible combination. For example, the system can include a power management module. The power management module can be electrically coupled to the at least one TEG, and can be configured to receive at least a portion of the first electric power. The power management module can be electrically coupled to the at least one TEC, and can be configured to deliver at least a portion of the second electric power to the TEC. The system can include at least one temperature sensor positioned adjacent to at least one of the first end and the second end of the at least one TEG, and the first end and the second end of the at least one TEC, the temperature sensor being configured to measure a temperature of condenser at the position. The system can include a thermal management module configured to receive a temperature signal from the at least one temperature sensor, and to calculate a corresponding temperature.

In yet another aspect, a method includes delivering a fluid to a body of a heat exchanger; transferring heat from the fluid to the body; transferring heat from the body to a first end of a thermoelectric generator (TEG); delivering a first electric power to a thermoelectric cooler (TEC) thereby causing a first end of the TEC to increase in temperature and a second end of the TEC to decrease in temperature; transferring heat from a second end of the TEG to the second end of the TEC; and creating a temperature gradient across semiconductors of the TEG, thereby causing the TEG to generate a second electric power.

One or more of the following features can be included in any feasible combination. For example, the method can include delivering at least portion of the second electric power to the TEC. The method can include storing at least a portion of the second electric power within batteries. The method can include measuring a temperature of the heat exchanger at a location adjacent to at least one of the first and second ends of the TEG, and adjusting at least one of a voltage and a current of the first electric power delivered to the TEC based on the measured temperature. The method can include measuring a temperature of the heat exchanger at a location adjacent to at least one of the first and second ends of the TEC, and adjusting at least one of a voltage and a current of the first electric power delivered to the TEC based on the measure temperature. The method can include delivering at least a portion of the second electric power to a compressor that compresses the fluid.

Another aspect of the present disclosure provides an apparatus for waste heat recovery. The apparatus may include a base block disposed adjacent to a heat source, a thermoelectric generator including a first end and a second end, the first end being thermally coupled to the base block and configured to receive heat from the heat source, and a thermoelectric cooler including a third end and a fourth end, the third end being thermally coupled to the second end. The thermoelectric cooler may be configured to receive an electric current, which may cause the third end to cool and the fourth end to heat such that the third end may conduct heat from the second end.

One or more of the following features can be included in any feasible combination. For example, the thermoelectric generator may be configured to generate electrical power, and at least a portion of the generated electrical power may be supplied to the thermoelectric cooler for cooling. The heat source may include a kiln. The base block may include a heat exchanger on a side that faces the heat source. A heat sink may be disposed on the fourth end. The apparatus may include a temperature sensor to measure a temperature of a surface of the heat source. For example, the temperature sensor may be a thermocouple, a resistance temperature detector (RTD), or an infrared sensor. Upon detecting that the temperature of the surface of the heat source is greater than a predetermined temperature limit, an electric current may be provided to the thermoelectric generator such that the first end may be cooled and the second end be heated.

In another aspect, a system for waste heat recovery may include a kiln including a cylindrical shape, and a plurality of the apparatus described herein may be disposed to surround the kiln, using the kiln as the heat source.

In yet another aspect, an apparatus for waste heat recovery may include a base block disposed above a heat source, a first vertical fin protruding from an upper surface of the base block at a left side of the base block, a second vertical fin protruding from an upper surface of the base block at a right side of the base block, a first thermoelectric generator thermally coupled to a right side surface of the first vertical fin, a second thermoelectric generator thermally coupled to a left side surface of the second vertical fin, a first thermoelectric cooler thermally coupled to a right side surface of the first thermoelectric generator, a second thermoelectric cooler thermally coupled to a left side surface of the second thermoelectric generator, and a heat sink disposed thermally coupled to both a right side surface of the first thermoelectric cooler and a left side surface of the second thermoelectric cooler.

One or more of the following features can be included in any feasible combination. For example, the first and the second thermoelectric generators may be configured to generate electrical power, and at least a portion of the generated electrical power may be supplied to the first and the second thermoelectric coolers. The base block may include a heat exchanger on a side that faces the heat source. The heat sink may include a plurality of heat dissipation fins.

In yet another aspect, a system for waste heat recovery may include a kiln including a cylindrical shape, and a plurality of the apparatus described herein may be disposed to surround the kiln, using the kiln as the heat source.

In yet another aspect, a method for waste heat recovery may include receiving heat from a heat source, generating electricity with the received heat in a thermoelectric generator, and supplying at least a portion of the generated electricity to a thermoelectric cooler. One or more of the following features may be included in any feasible combination. For example, the method may include measuring a temperature of a surface of the heat source, and electrically disconnecting the thermoelectric generator in response to determining that the measured temperature is greater than or equal to a first preset temperature. The method may include supplying electricity to the thermoelectric generator such that the thermoelectric generator may be operated to cool the heat source in response to determining that the measured temperature is greater than or equal to a second preset temperature.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

DETAILED DESCRIPTION

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

In an aspect, the current subject matter can include a condenser for removing heat from a refrigerant. The condenser can include one or more thermoelectric generators (TEGs), which can convert heat into electrical energy. The TEGs can generate electrical energy as a result of temperature gradients that form within the TEGs. A portion of the heat from the refrigerant can be delivered to one or more TEGs, thereby creating the temperature gradient, and the TEGs can generate electrical energy. In order to optimize the efficiency of the TEGs, one or more thermoelectric coolers (TECs) can be utilized to manage the temperature gradients within the TEGs. The current subject matter can result in increased efficiency of cooling systems, such as cooling systems. In some implementations, the current subject matter can allow for all of the components of the cooling system to be located in the same general vicinity by reducing waste heat, which can allow for simplified cooling system designs. In some implementations, rather than using TECs to manage temperature gradients within the TEGs, other heat removal devices can be used. For example, a combination of fans and heat sinks can be used to provide controlled forced convection to manage the temperature gradients within the TEGs.

Figure 1:
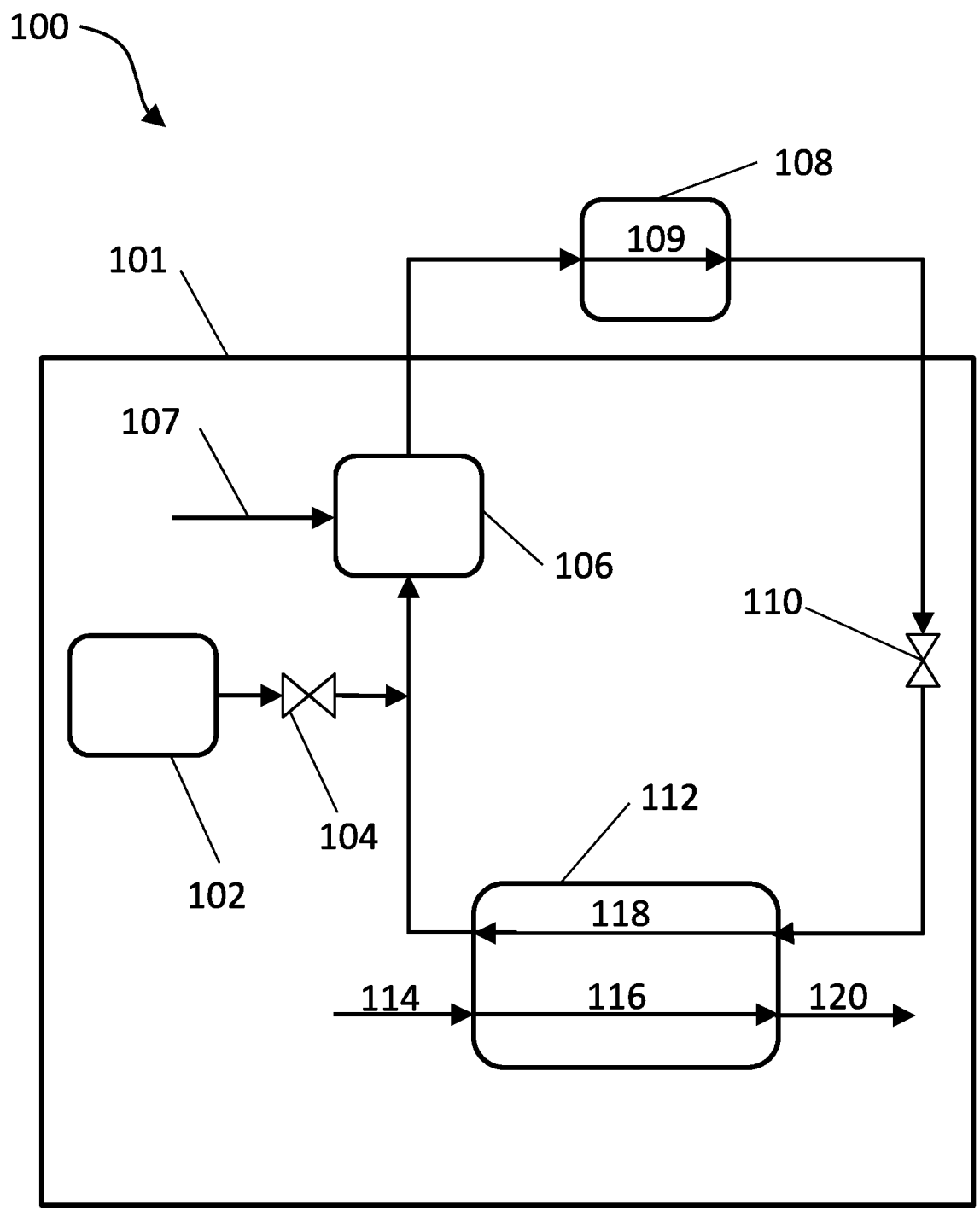
FIG. 1 is a diagram of an embodiment of a cooling system.

FIG. 1 shows a diagram showing one embodiment of a cooling system 100 that can be used to cool at least a portion of a volume 101. The volume 101 can be, or can include, for example, a data center. The cooling system 100 can include a refrigerant supply system 102 that can introduce a refrigerant (e.g., R410, R312) to the cooling system 100 via a valve 104. Initially, low-pressure, low-temperature refrigerant vapor can be delivered to a compression system 106. The compressors can be driven by electric motors that can receive electric power 107 from an external power source. When the refrigerant leaves the compression system 106, it can be in a high-temperature, high-pressure, vapor state. The refrigerant can subsequently flow to one or more condensers/aftercoolers 108 that are downstream of the compression system 106. The condensers 108 can facilitate a phase change of the refrigerant 109 from vapor, or mostly vapor, to a predominantly liquid state by removing excess heat generated during the compression process. Once at least a portion of the refrigerant is in a condensed state it can travel through an expansion valve 110, which can create a pressure drop that can put at least a portion of the refrigerant in a low-pressure, low-temperature, liquid state. The liquid refrigerant can be then delivered to a heat exchanger 112 (e.g., an evaporator) to cool incoming air 114 from a data center environment. The heat exchanger 112 can be, e.g., a core plate and fin style heat exchanger. Alternatively, other heat exchangers (e.g. core, etched plate, diffusion bonded, wound coil, shell and tube, plate-and-frame) can be used.

Refrigerants can travel through cooling passages, cooling elements, or within a shell, to provide refrigeration to a "hot fluid" such as air from a data center. As the air 116 travels through the heat exchanger 112 it can be cooled by exchanging heat with the refrigerant 118 within through the heat exchanger 112. The air 120 can then be released from the heat exchanger 112 to cool the volume 101, e.g, the data center. The refrigerant can then be delivered back to the compression system 106, and the cycle can repeat.

In general, heat that is absorbed within the condensers 108 can be released in a number of ways. In the illustrated embodiment, condensers 108 can be located outside of the volume 101, on a roof, for example, and can release heat to ambient air. One benefit of the cooling system 100 shown in FIG. 1 is that it can be easy to maintain. However, the system can be costly and difficult to design and implement depending on distances that pipes must travel, variations in height between the condensers 108 and other components of the system 100, and varying outdoor weather. To avoid the aforementioned drawbacks, it can be beneficial to design a cooling system where the condenser is in close proximity to the other components of the cooling system.

Figure 2:
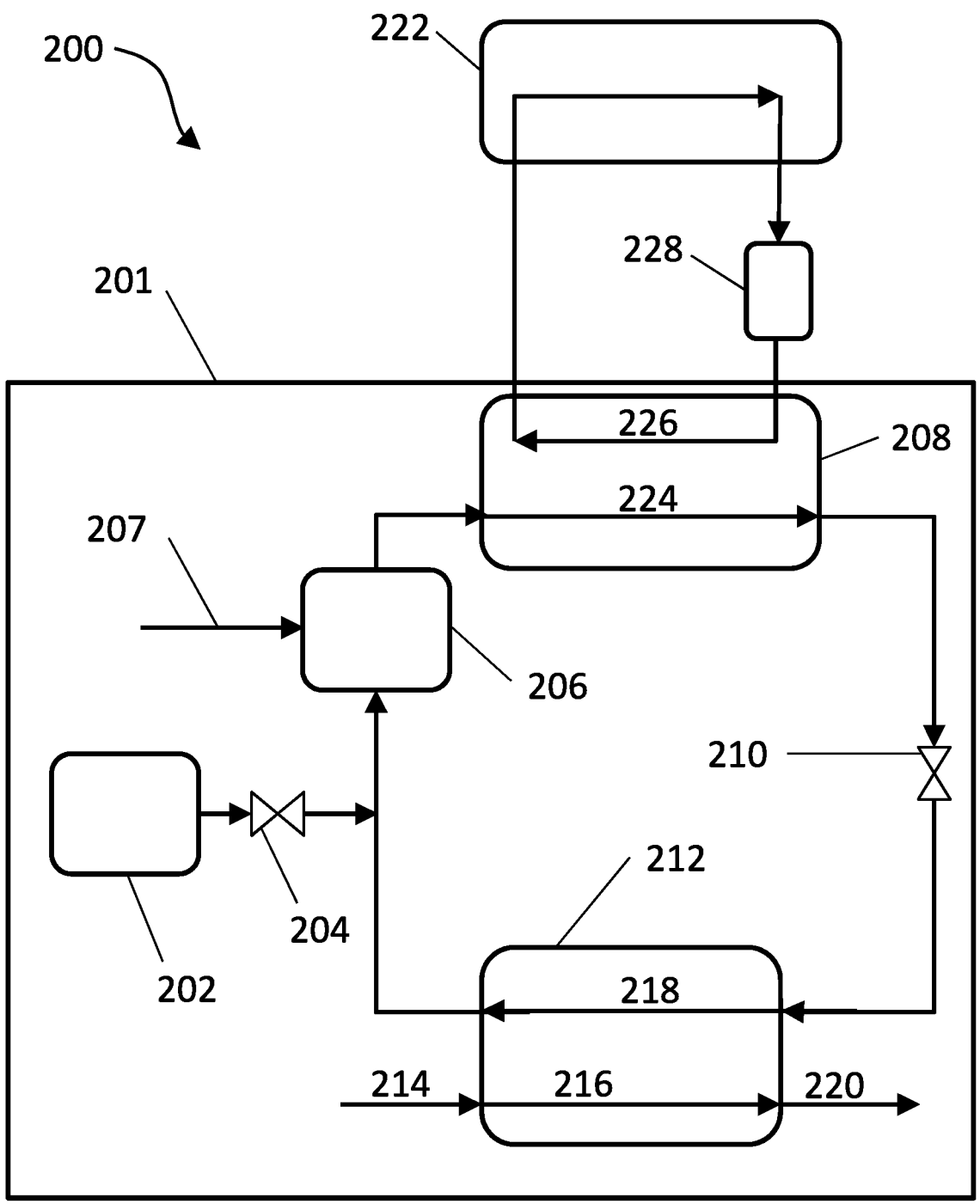
FIG. 2 is a diagram of another embodiment of a cooling system.

FIG. 2 shows another embodiment of an example cooling system 200 that can be used to cool at least a portion of a volume 201. The volume 201 can be, or can include, e.g., an indoor portion of a data center. The cooling system 200 can generally be similar to cooling system 100, but it can have a first heat exchanger 208 that can transfer heat from a compressed refrigerant to a cooling fluid that can circulate between the first heat exchanger 208 and a second heat exchanger 222.

The cooling system 200 can include a refrigerant supply system 202 that can introduce a refrigerant to the cooling system 200 via a valve 204. The refrigerant can be delivered to a compression system 206, which can receive electric power 207 from an external power source. The refrigerant can then travel through to the first heat exchanger 208, which can also be referred to as a condenser. The refrigerant can then travel through an expansion valve 210 and a heat exchanger 212 to cool incoming air 214, as described above with regard to cooling system 100. As the air 216 travels through the heat exchanger 212 it can be cooled by exchanging heat with the refrigerant 218 within the heat exchanger 212. The air 220 can then be released from the heat exchanger 212 to cool the volume 201. The refrigerant can then be delivered back to the compression system 206, and the cycle can repeat.

In the illustrated example, heat from the refrigerant 224 within the first heat exchanger 208 can be transferred to a cooling fluid 226 that can circulate between the first heat exchanger 208 and the second heat exchanger 222. The cooling fluid can be, e.g., water, or another refrigerant, and can be pumped between the first and second heat exchangers 208, 222 using a pump 228. As shown in FIG. 2, the pump 228 and the second heat exchanger 222 can be located outside of the volume 201. The second heat exchanger 222 can be, e.g., a cooling tower or an air cooled condenser.

For both of the cooling systems 100, 200, shown in FIGS. 1 and 2, heat that is extracted from the refrigerants 109, 224 is ultimately released outside of the volumes 101, 201. Therefore, the configurations require that fluid delivery lines extend between indoor and outdoor components of the cooling systems 100, 200. Such constraints can result in increased complexity of the design of the cooling systems, as well as added complexity when implementing the design. Additionally, there can be a significant amount of energy that is wasted by releasing the heat from the refrigerants into the outdoor environment. Therefore, it can be beneficial to utilize a cooling system that includes a waste heat recovery system that can convert heat from a compressed refrigerant to useful electric power. Such a system can allow all of the components of the cooling system to be located in the same general vicinity since there will be less waste heat to manage.

In some embodiments, a waste heat recovery system can utilize at least one thermoelectric generator (TEG), and at least one thermoelectric cooler (TEC). TEGs, which can also be referred to as Seebeck generators, can be solid state devices that convert a heat flux (temperature difference) into electrical energy by taking advantage of the Seebeck effect. One side of a TEG can be coupled to a hot surface, and the other side can be coupled to a cold surface.

Figure 3:
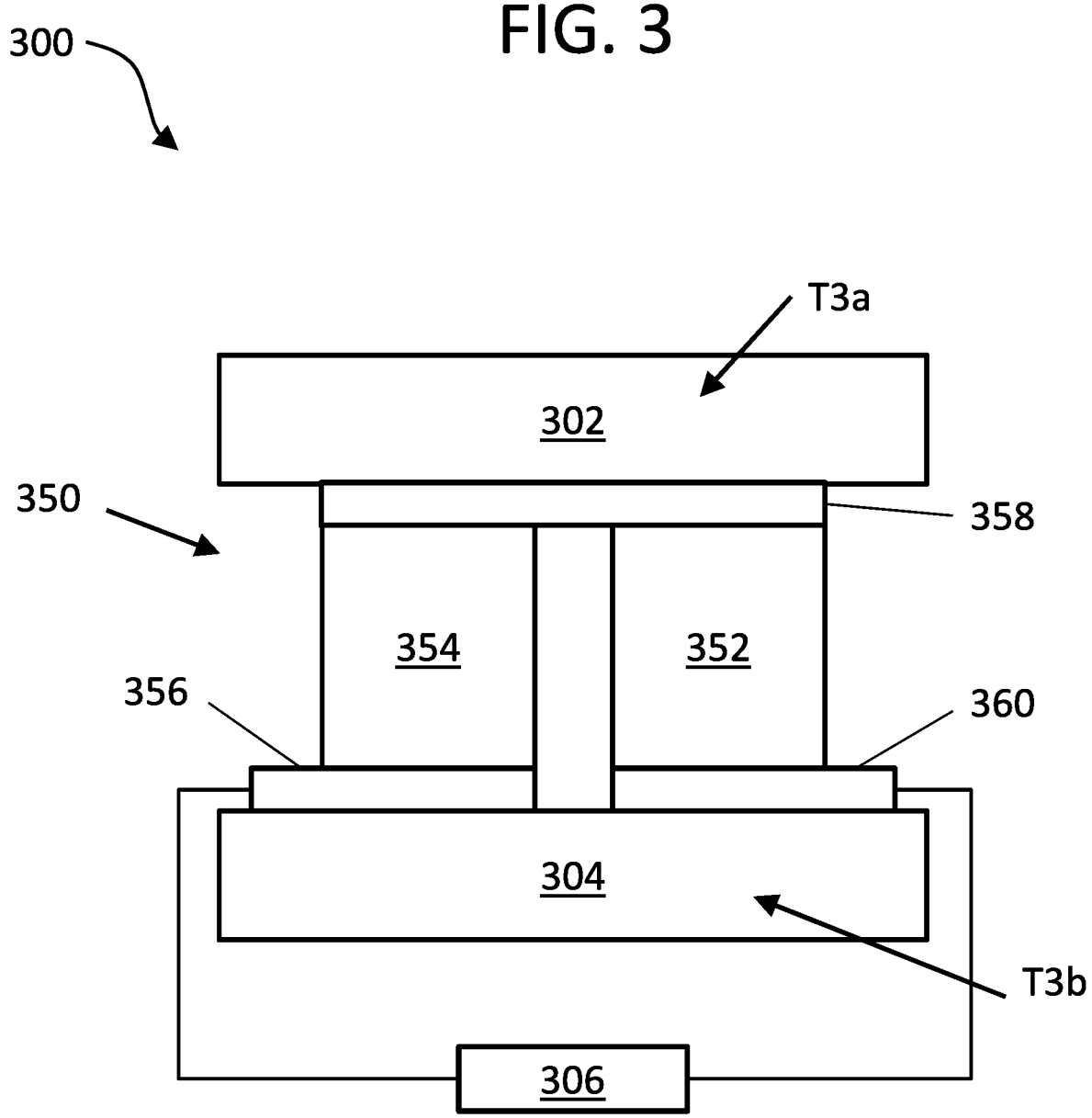
FIG. 3 is a diagram of an embodiment of a thermoelectric system that includes a TEG.

FIG. 3 shows an example of an example of a thermoelectric system 300 that can include a TEG 350. The thermoelectric system 300 can include the TEG 350, and a load 306. The TEG 350 can include a first thermally conductive element 302, which can be referred to as a "hot member" on a first end of the TEG 350, and a second thermally conductive element 304, which can be referred to as a "cold member" on a second end of the TEG 350. The TEG 350 can include at least one n-type semiconductor 352 and at least one p-type semiconductor 354 that can be positioned between the first thermally conductive element 302 and the second thermally conductive element 304 and can be coupled in series by a number of conductive members. The illustrated embodiment shows first, second and third conductive members 356, 358, 360. The first conductive member 356 is coupled to a first end of the p-type semiconductor 354, the third conductive member 360 is coupled to a first end the n-type semiconductor, and the second conductive member 358 is coupled to second ends of the p-type and n-type semiconductors 354, 352 such that the p-type semiconductor 354 and the n-type semiconductor 352 are coupled in series. The first and third conductive members 356, 360 can be electrically coupled to a load 306 such that power can be delivered to the load 306 from the TEG 350.

In operation, the first thermally conductive element 302 can receive heat from an external heat source such that it can be at a temperature $T3a$, and the second thermally conductive element 304 can be at a temperature $T3b$, where $T3a > T3b$. In some embodiments, heat can be extracted from the second thermally conductive element 304 to ensure that $T3a > T3b$. The first thermally conductive element 302 and the second thermally conductive element 304 can create thermal gradients across the p-type semiconductor 354 and the n-type semiconductor 352, which can cause majority charge carriers in the p-type semiconductor 354 and the n-type semiconductor 352 to move away from the first thermally conductive element 302 and toward the second thermally conductive element 304, and can cause minority charge carriers to move in the opposite direction. Accordingly, electrons in the n-type semiconductor 352 can move toward the second thermally conductive element 304, and positively charge "holes" in the p-type semiconductor 354 can move toward the second thermally conductive element 304. This charge motion can create a voltage potential across each semiconductor 352, 354. Since the semiconductors 352, 354 are coupled in series within a circuit, current can flow. Therefore, electrons can travel from the n-type semiconductor 352, through the third conductive member 360, through the load 306, to the first conductive member 356, through the p-type semiconductor 354, to the second conductive member 358, and back to the n-type semiconductor 352 to complete the circuit. Therefore, the TEG 350 can generate electric power, which can be delivered from the TEG 350 to the load 306. By controlling how much heat is delivered to the first thermally conductive element 302 and/or how much heat is extracted from the second thermally conductive element 304, the temperature gradients across the semiconductors 352, 354 can be controlled, efficiency of the TEG can be optimized, and power generation can be controlled.

TECs, which can be referred to as Peltier devices, Peltier heat pumps, and solid state refrigerators, can receive a DC electric current, and can utilize energy in the current to transfer heat from one side of the device to the other side of the device.

Figure 4:
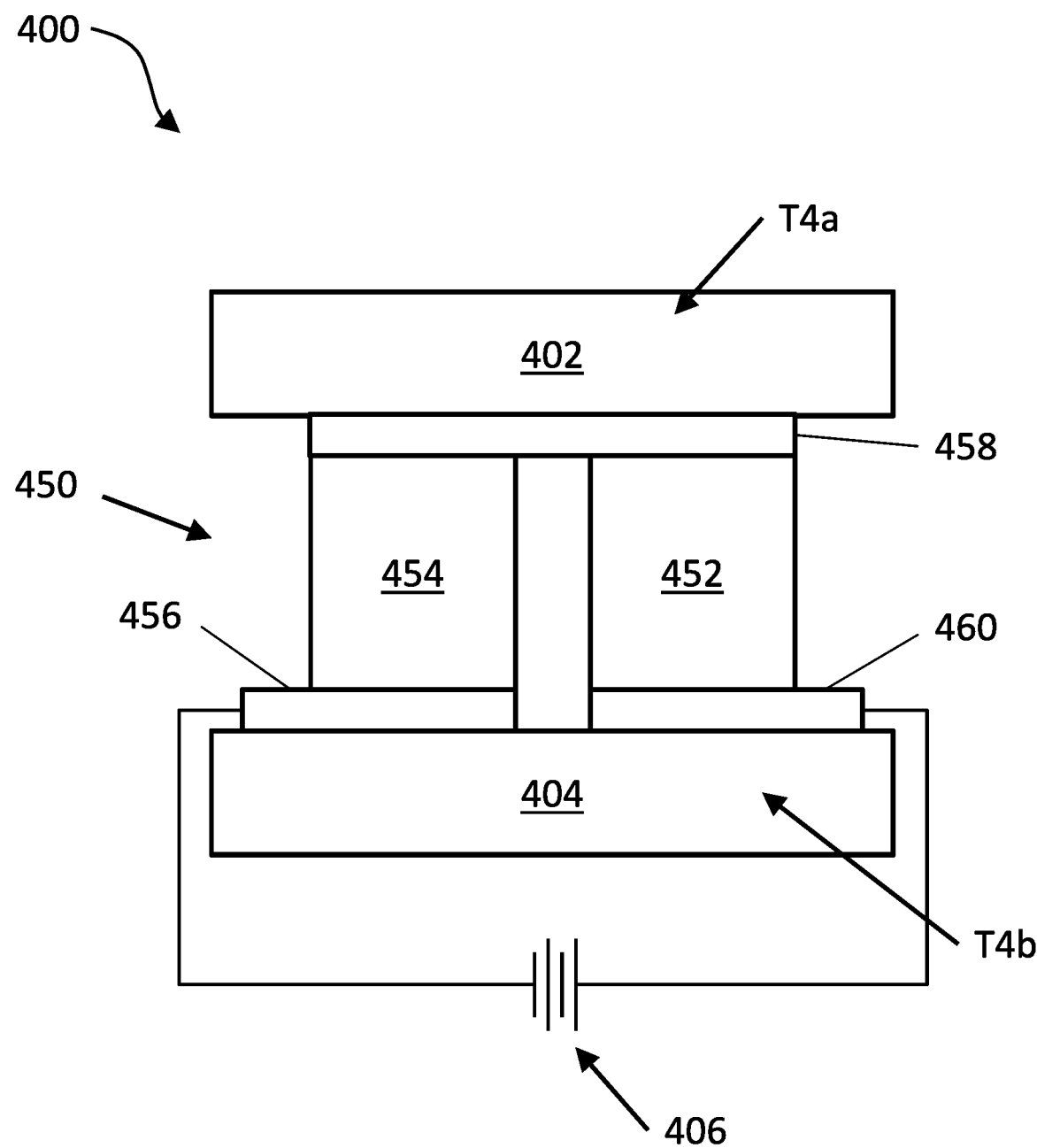
FIG. 4 is a diagram of an embodiment of a thermoelectric system that includes a TEG.

FIG. 4 shows an example of a thermoelectric system 400 that can include a TEC 450. The thermoelectric system 400 can include the TEC 450 and power source 406. The TEC 450 can include a first thermally conductive element 402 on a first end of the TEC 450, and a second thermally conductive element 404 on a second end of the TEC 450. The TEC 450 can include at least one n-type semiconductor 452 and at least one p-type semiconductor 454 that can be positioned between the first thermally conductive element 402 and the second thermally conductive element 404. The n-type and p-type semiconductors 452, 454 can be coupled in series by a number of conductive members. The illustrated embodiment shows first, second and third conductive members 456, 458, 460 that can be coupled to the n-type and p-type semiconductors 452, 454 in a manner similar to that describe above with regard to the first, second and third conductive members 356, 358, 360 that are coupled to the n-type semiconductor 352 and the p-type semiconductor 354.

In this case, the first and third conductive members 456, 460 can be electrically coupled to a power source 406 such that an electrical current, at a given voltage, can be run through the semiconductors 452, 454. In operation, current can travel from a negative terminal of the power source 406, through the first conductive member 456, the p-type semiconductor 454, the second conductive member 458, the n-type semiconductor 452, the third conductive member 460, and to a positive terminal of the power source 406. Accordingly, electrons in the n-type semiconductor 452 can move toward the second thermally conductive element 404, and positively charge "holes" in the p-type semiconductor 454 can move toward the second thermally conductive element 404. This charge motion can create a temperature gradient across each of the semiconductors 452, 454, with cooled ends corresponding to the direction charge motion of majority charge carriers for each of the semiconductors 452, 454. Therefore, current flowing through the TEC 450 can cause the first thermally conductive element 402 to heat, and can cause the second thermally conductive element 404 to cool. Accordingly, the first thermally conductive element 402 can be heated to a temperature T4a, and the second thermally conductive element 404 cooled to a temperature T4b, where T4a>T4b. By controlling the voltage and current, the temperature gradient across the semiconductors 452, 454 can be controlled. Accordingly, the temperatures T4a, T4b of the first thermally conductive element 402 and the second thermally conductive element 404 can be controlled.

TEGs can be used to convert heat to electric power. However, the efficiency of TEGs can be sensitive to thermal gradients across semiconductors used within the TEGs. Therefore, TECs can be used to manage temperature gradients across semiconductors in the TEGs.

Figure 5:
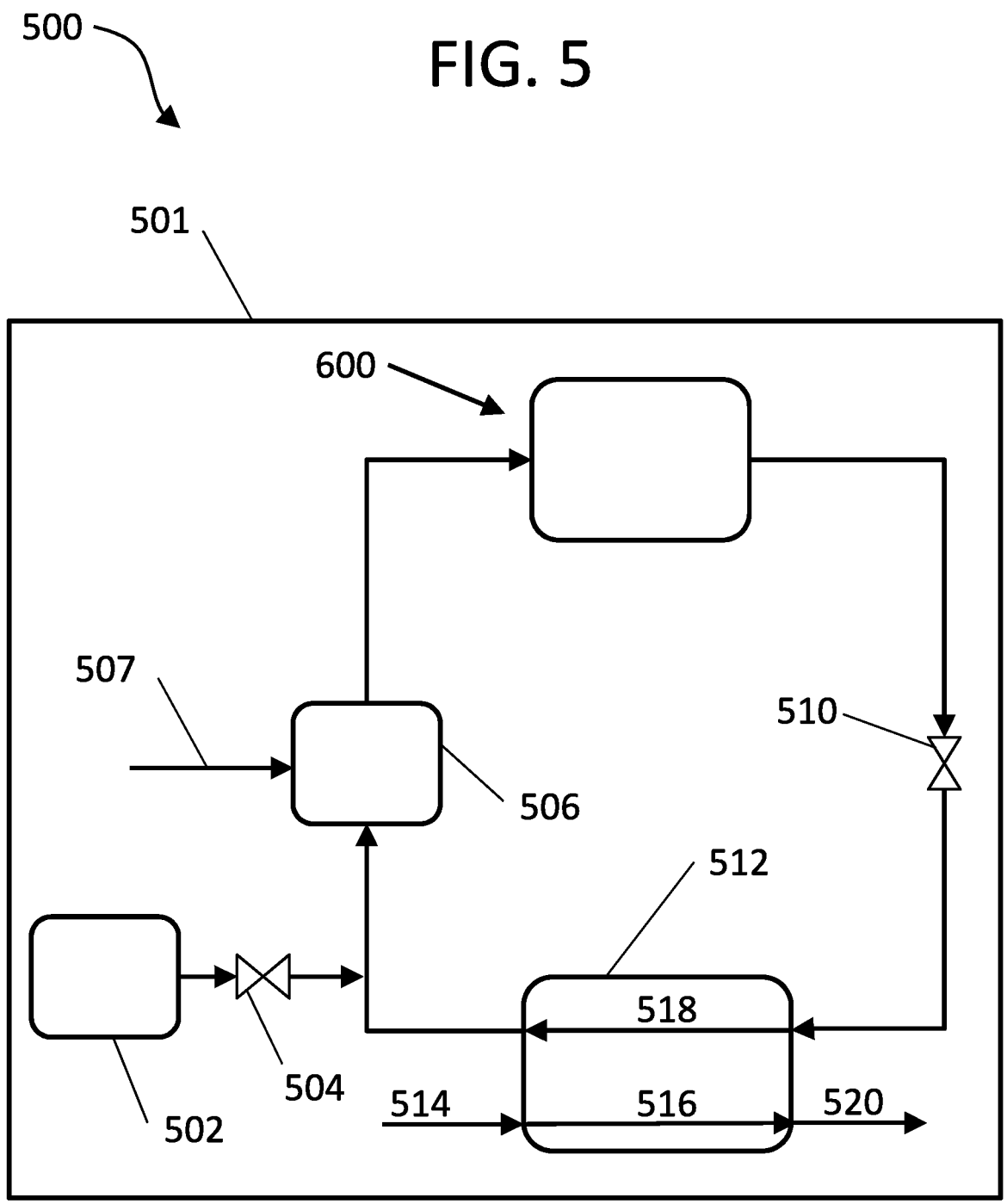
FIG. 5 is a diagram of an embodiment of a cooling system that includes an energy recovering (ER) condenser system.

FIG. 5 shows an example of a cooling system 500 that can be used to cool at least a portion of a volume 501. The volume 501 can be, or can include, e.g., an indoor portion of a data center. The cooling system 500 can generally be similar to cooling system 100, but it can include an energy recovering (ER) condenser system 600 that can remove heat from a compressed refrigerant and generate electric energy. The cooling system 500 can include the ER condenser system 600, a refrigerant supply system 502, a valve 504, a compression system 506 that can receive electric power 507 from an external power source, an expansion valve 510, and a heat exchanger 512 to cool incoming air 514, as described above with regard to cooling system 100. As the air 516 travels through the heat exchanger 512 it can be cooled by exchanging heat with the refrigerant 518 within the heat exchanger 512. The air 520 can then be released from the heat exchanger 512 to cool the volume 501.

Figure 6:
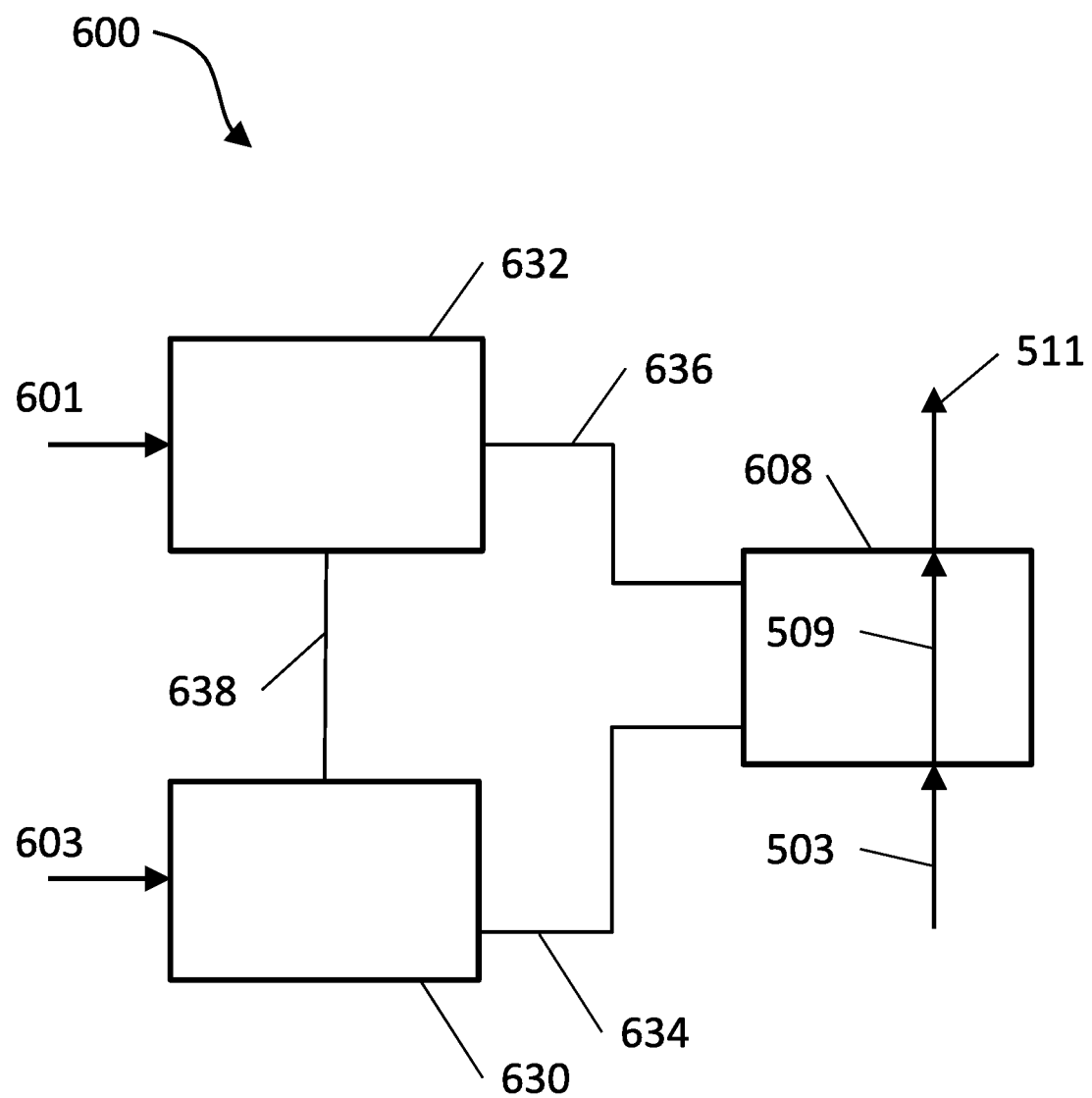
FIG. 6 is a diagram of an embodiment of the ER condenser system shown in FIG. 5.

FIG. 6 shows a schematic of the ER condenser system 600. The ER condenser system 600 can include a power generating (P-Gen) condenser 608, a power management module 630, and a thermal management module 632. The power management module 630 and the thermal management module 632 can each include at least one data processor that can receive, process, determine, and deliver, data. The power management module 630 and the thermal management module can be electrically coupled to the P-Gen condenser 608 using coupling elements 634, 636. Additionally, the power management module 630 can be electrically coupled to the thermal management module 632 via coupling element 638.

Compressed refrigerant 503 can be delivered to the P-Gen condenser 608. As the refrigerant 509 travels through the P-Gen condenser 608, the P-Gen condenser 608 can facilitate a phase change of the refrigerant 509 from vapor, or mostly vapor, to a predominantly liquid state by removing excess heat generated during the compression process. The refrigerant 511 can then exit the P-Gen Condenser 608, and travel through the rest of the cooling system 500, as described above with regard to cooling systems 100, 200, shown in FIGS. 1 and 2. As the refrigerant 509 travels through the P-Gen condenser 608, TEGs within the P-Gen condenser 608 can use heat that can be transferred from the refrigerant 509 to generate electric power.

As described above, the efficiency of TEGs can be sensitive to thermal gradients across semiconductors used within the TEGs. Therefore, TECs can be used to manage temperature gradients across semiconductors in the TEGs. The power management module 630 can receive electric power from the TEGs, and control an amount of electric power that can be delivered to the TECs, e.g., via the coupling element 634. The thermal management module 632 can monitor temperatures of various locations of the P-Gen condenser 608, and can communicate with the power management module 630 to control how much power is delivered to the TECs to optimize efficiency of the TEGs. The ER condenser system 600 is discussed in more detail below.

In some embodiments, the power management module 630 and the thermal management module 632 can receive electric power 601, 603 from external power sources. The electric power 601, 603 can be used to power various components within the power management module 630 and within the thermal management module 632.

Figure 7A:
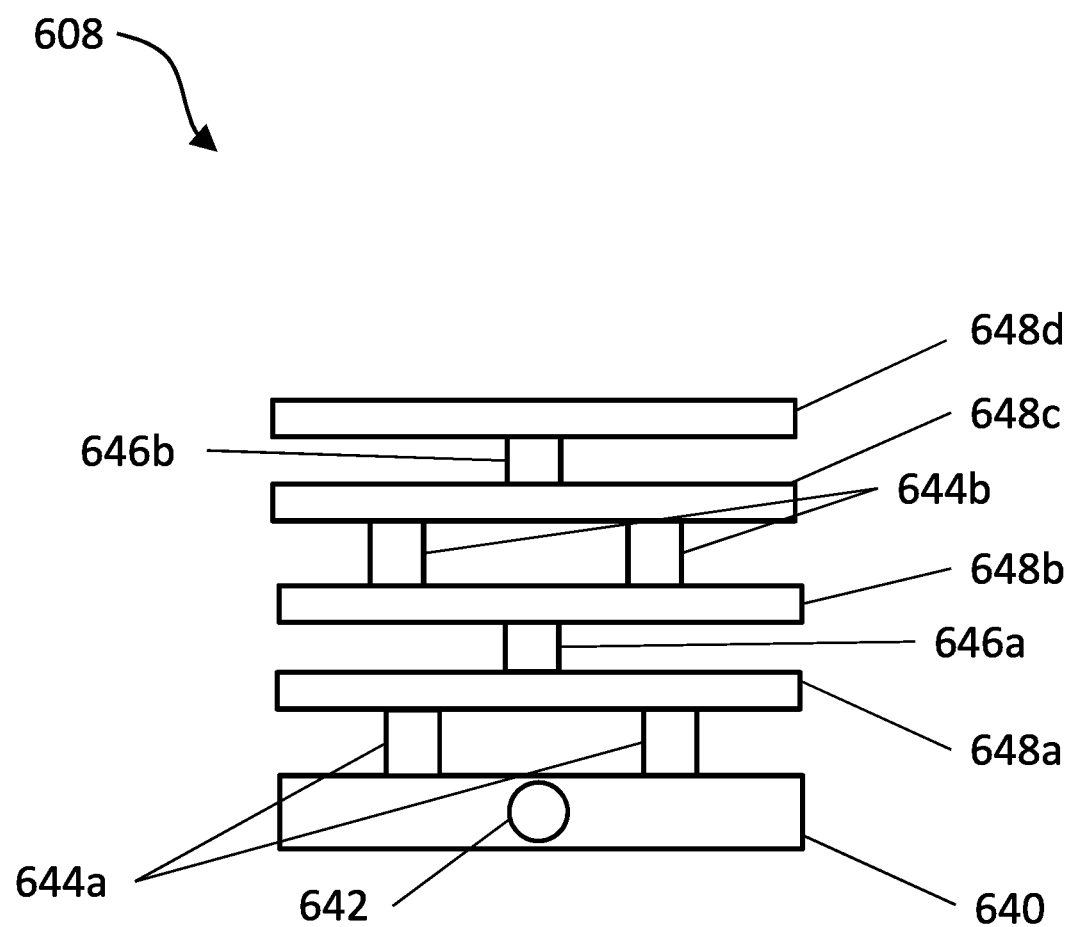
FIG. 7A is a diagram of an example a power generating (P-Gen) condenser of the ER condenser system shown in FIG. 6.
Figure 7B:
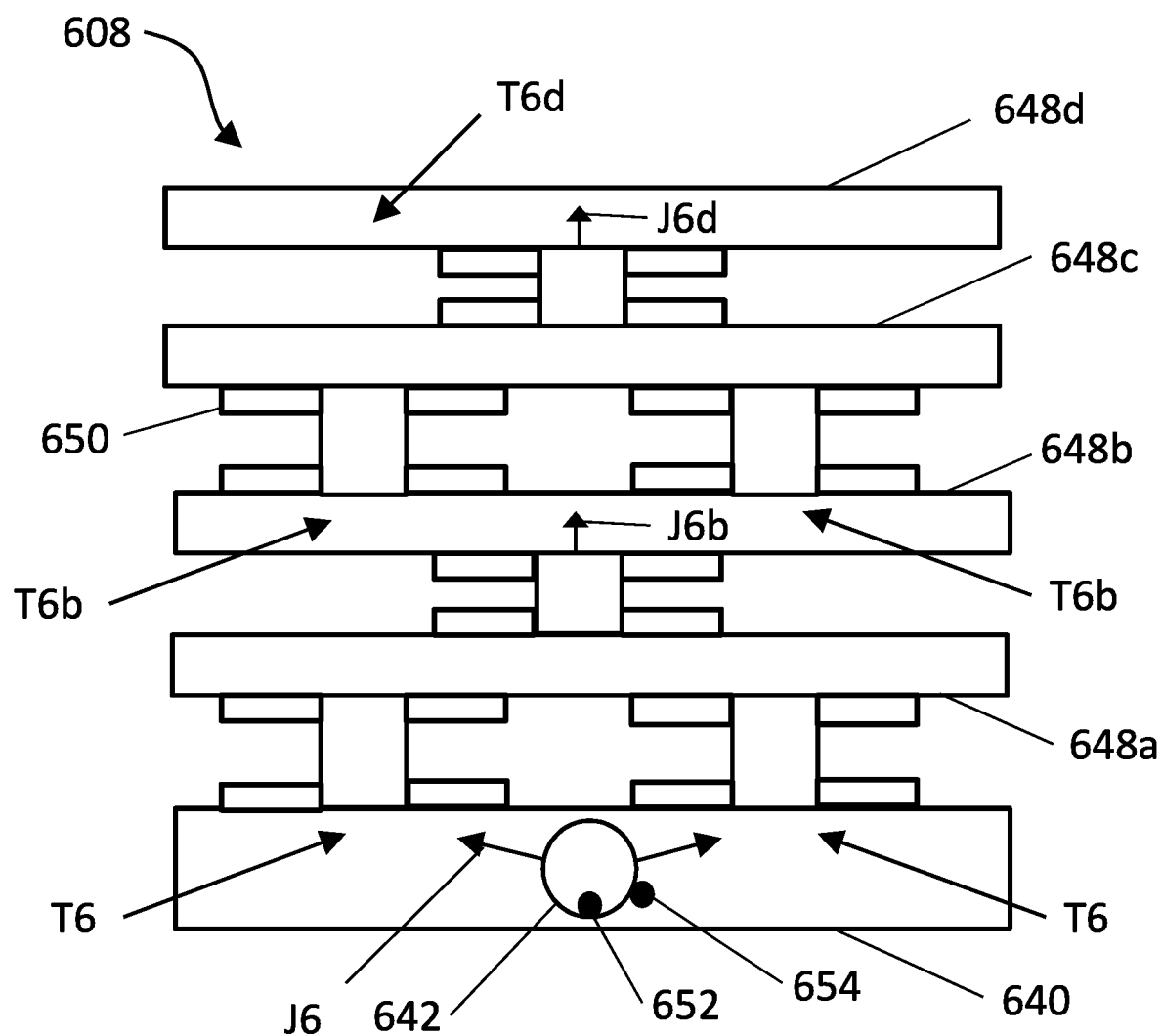
FIG. 7B is a diagram of the P-Gen condenser shown in FIG. 7A, including temperature sensors.

FIGS. 7A-7B show enlarged side views of the P-Gen condenser 608. As illustrated in FIG. 7A, the P-Gen condenser 608 can include a thermally conductive condensing member 640 at least one TEG, and at least one TEC. In some embodiments, the condensing member 640 can be a thermally conductive plate that can have at least one passage 642 extending therethrough. As an example, in some embodiments, the condensing member 640 can be created using additive manufacturing techniques. In some embodiments, the condensing member 640 can be made from a single piece of material. In some embodiments, the condensing member 640 can have multiple passages 642 that can extend through the condensing member 640 in any number of configurations. The illustrated embodiment shows first and second sets of TEGs 644a, 644b, as well as first and second TECs 646a, 646b. The TEGs 644a, 644b can generally be similar to TEG 350, shown in FIG. 3, and the TECs 646a, 646b can generally be similar to TEC 450, shown in FIG. 4. The TEGs 644a, 644b and TECs 646a, 646b can have thermally conductive members 648a, 648b, 648c, 648d coupled to their ends. In some embodiments, the thermally conductive members 648a, 648b, 648c, 648d can be in the form of thermally conductive plates.

As described above with regard to the TEG 350, shown in FIG. 3, the TEGs 644a, 644b can include a first thermally conductive element, which can transfer heat to semiconductors within the TEGs 644a, 644b, and a second thermally conductive element, which can transfer heat away from semiconductors within the TEGs 644a, 644b. Similarly, as described above with regard to the TEC 450, shown in FIG. 4, the TECs 646a, 646b can include first thermally conductive elements, which can be heated as current flows through the TECs 646a, 646b, and second thermally conductive elements, which can be cooled when current flows through the TECs 646a, 646b. The TEGs 644a, 644b and TECs 646a, 646b can be coupled to opposite sides of the thermally conductive members 648a, 648b, 648c, 648d.

The TEGs 644a, 644b and the TECs 646a, 646b can be oriented such that the second thermally conductive elements of the TEGs 644a, 644b and the TECs 646a, 646b can be coupled to opposite sides of the thermally conductive members 648a, 648b, 648c, 648d. Accordingly, the first thermally conductive elements of the TEGs 644a, 644b and the TECs 646a, 646b can be coupled to opposite sides of the thermally conductive members 648a, 648b, 648c, 648d.

The first set of TEGs 644a can be oriented such that the first thermally conductive elements are coupled to the condensing member 640, and the second thermally conductive elements are coupled to one side of the conductive member 648a. The first TEC 646a can be oriented such that the second thermally conductive element is coupled to the opposite side of the conductive member 648a and the first thermally conductive element is coupled to one side of another conductive member 648b. The second set of TEGs 644b can be oriented such that the first thermally conductive element are coupled to the opposite side of the conductive member 648b, and the second thermally conductive element are coupled to one side of another conductive member 648c. The second TEC 646b can be oriented such that the second thermally conductive element is coupled to the opposite side of the conductive member 648c and the first thermally conductive element is coupled to one side of another conductive member 648d. Therefore, the second thermally conductive elements of the TECs 646a, 646b can be thermally coupled to the second thermally conductive elements of the TEGs 644a, 644b, and the second thermally conductive elements of the TECs 646a, 646b can extract heat from the second thermally conductive elements of the TEGs 644a, 644b. Additionally, the first thermally conductive element of the first TEC 646a can be thermally coupled to the first thermally conductive elements of the second pair of TEGs 644b, and the first thermally conductive element of the first TEC 646a can deliver heat to the first thermally conductive elements of the second pair of TEGs 644b.

In some embodiments, the conductive members 648a, 648c can be the second thermally conductive elements of the TEGs 644a, 644b and the TECs 646a, 646b. The condensing member 640 can be the first thermally conductive elements of the first pair of TEGs 644a, the conductive plate 648b can be the first thermally conductive elements of the second set of TEGs 644b and of the first TEC 646a, and the conductive plate 648b can be the first thermally conductive element of the second TEC 646b.

As shown in FIG. 7B, the P-Gen condenser 608 can also include one or more temperature sensors 650, 652, 654. The temperature sensors 650, 652, 654 can be, e.g., thermocouples and/or resistance temperature detectors (RTDs). The temperature sensors 650 can be coupled to the condensing member 640 and/or thermally conductive members 648a, 648b, 648c, 648d, and can be positioned adjacent to at least one of the 644a, 644b and/or TECs 646a, 646b. The temperature sensors, 652, 654 can be coupled to the condensing member 640 and can be positioned within, and/or adjacent to, the passage 642 to measure the temperature of the refrigerant as it travels through the passage 642. In some embodiments, one or more temperature sensors 652, 654 can be positioned at an inlet of the passage 642, and one or more temperature sensors can be positioned at an outlet of the passage 642. In some embodiments, temperature sensors 652, 654 can be positioned at even intervals along the length of the passage 642 to measure the temperature of the refrigerant as it travels through the passage 642.

In the illustrated example, there are twice as many TEGs 644a, 644b as TECs 646a, 646b. However, the number of TEGs and TECs can vary depending on other design considerations. For example, the amount of heat desired to be extracted from the refrigerant can be used to determine the number of TEGs and TECs that are used within the P-Gen condenser 600. In some embodiments, the TEGs can be configured to generate different amounts of power. For example, an amount of heat desired to be extracted from the refrigerant, and/or a temperature of the refrigerant, can be used to determine amounts of power that the TEGs are configured to generate. For example, TEGs positioned at downstream portions of the P-Gen condenser 608 can be configured to generate less electric power than TEGs positioned at upstream portions of the P-Gen condenser 608 if less heat is to be extracted downstream. Therefore, a length of the passage 642, and relative positions of the TEGs, can be used to determine amounts of power that the TEGs are configured to produce. As another example, the second set of TEGs 644b can be configured to generate less electric power than the first set of TEGs 644a since the temperature gradient across the second set of TEGs 644b can be less than the temperature gradient across the first set of TEGs 644a. Moreover, TEGs can be coupled in series and/or in parallel, depending on a desired output voltage and/or current. In a preferred embodiment, there can be more TEGs than TECs.

In operation, refrigerant can enter the passage 642 and travel through the P-Gen condenser 608, thereby transferring heat from the refrigerant to the condensing member 640. A portion of the heat from the refrigerant can be transferred from the condensing member 640 to a first end of the TEGs 644a.

The power management module 630 can deliver electric power to the TECs 646a, 646b, which can cause a first end of each of the TECs 646a, 646b to heat, and a second end of each of the TECs 646a, 646b to cool. In some embodiments, the electric power that is delivered to the TECs 646a, 646*b* can be a portion of the electric power 603 that the power management module 630 receives from an external power source. Each of the TECs 646*a*, 646*b* can receive different amounts of electric power.

The second ends of the TECs 646*a*, 646*b* can extract heat from the conductive members 648*a*, 648*c*, and the first ends of the TECs 646*a*, 646*b* deliver heat to conductive members 648*b*, 648*d*, thereby cooling conductive members 648*a*, 648*c* and heating conductive members 648*b*, 648*d*.

The cooled thermally conductive members 648*a*, 648*c* and the heated thermally conductive members 648*b*, 648*d* can extract heat from, and transfer heat to, opposite sides of the TEGs 644*a*, 644*b*, thereby creating temperature gradients across semiconductors within the TEGs 644*a*, 644*b*.

The TEGs 644*a*, 644*b* can generate electric power and deliver at least a portion of the electric power to the power management module 630. The amount of power that the TEGs 644*a*, 644*b* generate can be dependent on temperature gradients within the semiconductors of the TEGs 644*a*, 644*b*.

Figure 7C:
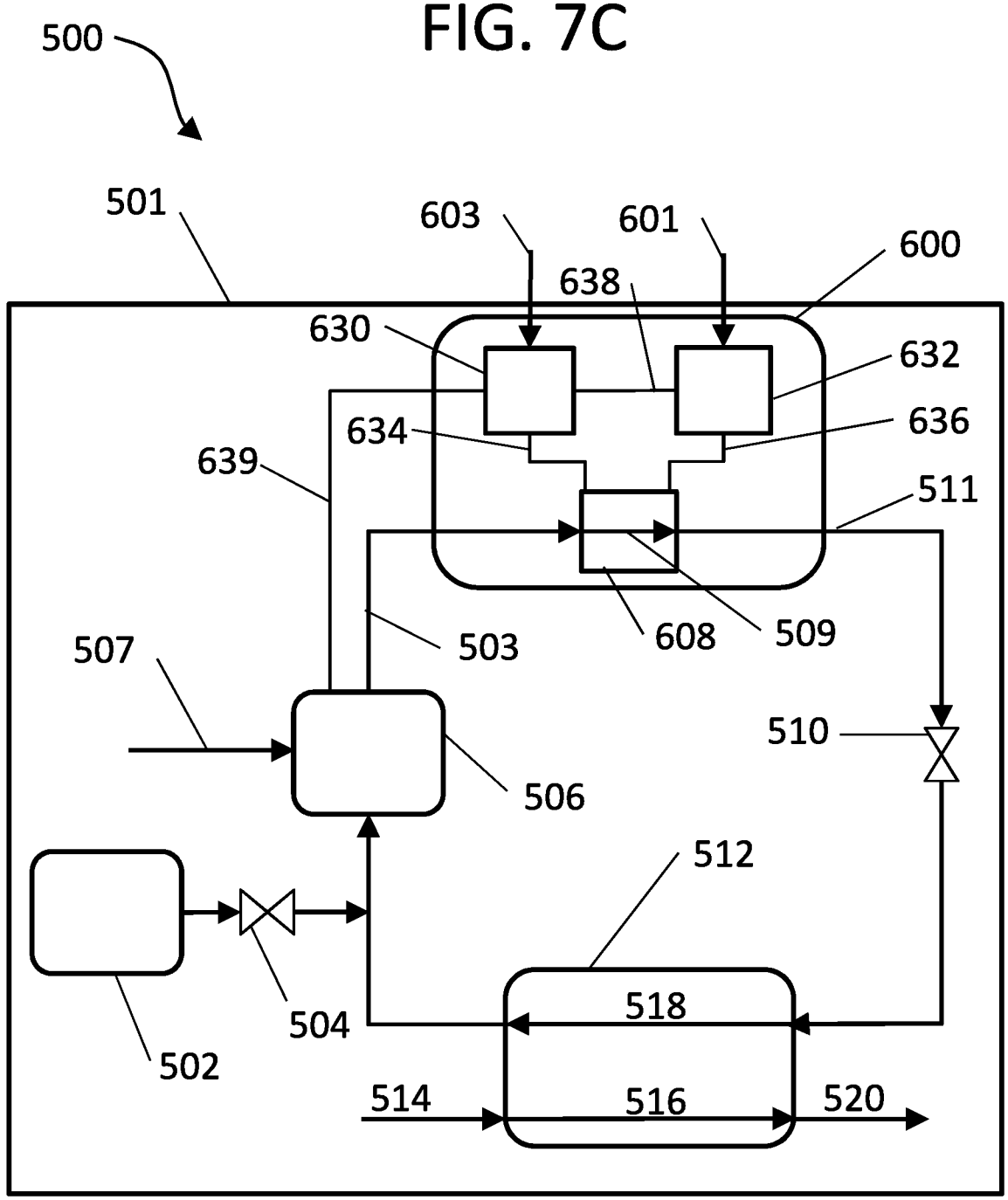
FIG. 7C is a diagram of the embodiment of the cooling system shown in FIG. 5, including the ER condenser system shown in FIG. 6.

The power management module 630 can measure the amount of electric power generated by the TEGs 644*a*, 644*b*, can store at least a portion of the electric power as electrical energy, and/or deliver a portion of the electric power to the TECs 646*a*, 646*b* to power them. In some embodiments, the power management module 630 can store the electrical energy in batteries. Additionally, power management module 630 can be electrically coupled to the compression system 506 via a coupling element 639, as illustrated in FIG. 7C, and can deliver a portion of the electrical energy to the compression system 506 to power the compressors.

In some embodiments, depending on the type of temperature sensors 650, 652, 654 that are used, the thermal management module 632 can deliver a portion of the electric power 601 to the temperature sensor 650, 652, 654 (e.g., via the coupling element 636) to power them. Alternatively, or additionally, the power management module 630 can deliver a portion of the electric power 603 to the temperature sensors 650, 652, 654 (e.g., via the coupling element 634) to power them.

The temperature sensors 650, 652, 654 can measure temperatures at various locations of the P-Gen condenser 608, and can deliver temperature signals characterizing measured temperatures to the thermal management module 632 (e.g. via the coupling element 636). As shown in FIG. 7B, the temperature sensors 650 can measure temperatures of the condensing member 640 and of the conductive members 648*a*, 648*b*, 648*c*, 648*d* as locations adjacent to the TEGs 644*a*, 644*b* and TECs 646*a*, 646*b*. The temperature sensors 652, 654 can measure temperatures of the refrigerant within the passage 642, and/or temperatures of the condensing member 640 at positions adjacent to the passage 642. The thermal management module 632 can receive the temperature signals, calculate corresponding temperatures, and deliver one or more control signals characterizing the calculated temperatures to the power management module 630. In some embodiments, the thermal management module 632 can provide instructions to the power management module 630. For example, the thermal management module 632 can provide instructions to the power management module 630 to increase or decrease the amount of power delivered to the TECs 646*a*, 646*b* based on the calculated temperatures. For example, in some cases the instruction can include data characterizing changes in voltage and/or current corresponding to power delivered to the TECs 646*a*, 646*b*.

The power management module 630 can receive the control signals, including the instructions, process them, adjust the amount of electric power delivered to the TECs 646*a*, 646*b* based on the information provided with control signals. Each of the TECs 646*a*, 646*b* can receive a different amount of power, depending on temperatures measured by the temperature sensors 650.

Depending on changes in the temperatures measured by the temperature sensors 650, 652, 654 the thermal management module 632 can deliver an adjusted storage signal to the power management module 630 to adjust the amount of electrical energy that is stored in batteries and/or it can deliver an adjusted power delivery signal to the power management module 630 to adjust a rate at which electrical energy is delivered to the TECs 646*a*, 646*b*. As an example, the thermal management module 632 can deliver an adjusted power delivery signal to the power management module 630 to adjust the amount of electric power delivered to the TECs 646*a*, 646*b*. By changing the amount of electric power delivered to the TECs 646*a*, 646*b*, the temperatures of the conductive members 648*a*, 648*b*, 648*c*, 648*d* can be changed, thereby altering the amount of electric power that the TEGs produce.

The first TEC 646*a* can function to remove heat from the conductive member 648*a* to deliver heat to the conductive member 648*b*, thereby cooling the conductive member 648*a* and heating the conductive member 648*b*. Similarly, the second TEC 646*b* can transfer heat from the conductive member 648*c* to the conductive member 648*d*, thereby cooling the conductive member 648*c* and heating the conductive member 648*d*.

As described above, the condensing member can receive heat J6 from the refrigerant, and the conductive members 648*b*, 648*d* can receive heat J6*b*, J6*d* from the TECs 646*a*, 646*b*. In some embodiments, the amount of heat that each of the conductive members 648*b*, 648*d* receives can decrease with each sequential layer of TEGs and TECs such that J6>J6*b*>J6*d*. Accordingly, in some embodiments, the condensing member 640 can have an average temperature T6, the conductive member 648*b* can have an average temperature T6*b*, and the conductive member 648*d* can have an average temperature T6*d*, where T6>T6*b*>T6*d*. Temperatures at various locations on the conductive members 648*a*, 648*b*, 648*c*, 648*d* will depend on the arrangement of TEGs and TECs, as well as amount of thermal resistance that can exist between the conductive members 648*a*, 648*b*, 648*c*, 648*d*, TEGs 644*a*, 644*b*, and TECs 646*a*, 646*b*.

Additionally, the amount of heat available for TEGs to absorb can decrease with each sequential layer of TEGs and TECs. Therefore, the first pair of TEGs 644*a* can absorb more heat than the second pair of TEGs 644*b*. Accordingly, in some embodiments, the first thermally conductive elements of the first pair of TEGs 644*a* can be at a higher temperature than the first thermally conductive elements of the second pair of TEGs 644*b*.

In some embodiments, in addition to, or as an alternative to, using TEGs 644*a*, 644*b* an organic Rankine cycle can be used to recover waste heat from condensing a refrigerant. For example, the P-Gen condenser can include a turbine coupled thereto. High-temperature, high-pressure, vapor refrigerant can be delivered to the turbine. As the refrigerant travels through the turbine, it can drive a shaft of the turbine. Mechanical work from the turbine shaft can be used directly, e.g., to drive compressors of the compression system 506, or it can be converted to electrical energy using a DC generator. The electrical energy can be delivered to the power management module 630, where it can be stored in batteries, and/or distributed as desired. For example, a portion of the electrical energy can be delivered to the TECs 646*a*, 646*b* to power them. As another example, a portion of the electrical energy can be delivered to the compressor system 506 to power compressors. The refrigerant can then be delivered to a condenser portion of the P-Gen condenser 608. The condenser system 600 can facilitate a phase change of the refrigerant from vapor, or mostly vapor, to a predominantly liquid state by removing excess heat generated during the compression process. The refrigerant can continue through the cooling system 500, as described above.

The ER condenser system 600 can provide many technical advantages. For example, by converting waste heat into electrical power, the efficiency of the cooling system 500 can be increased. Additionally, the ER condenser system 600 can allow all of the components of a cooling system to be located in the same general vicinity since there will be less waste heat to manage. The design of cooling system can be simplified since waste heat does not need to be released into the environment. This can enable constructing data centers in buildings or locations that would otherwise not be viable options due to complex construction requirement and/or costs associated with constructing and maintaining the data center. The ER condenser system 600 may not rely on exchanging heat with an external environment. Therefore, the cooling system 500 can be more efficient and stable than other cooling systems (e.g., cooling system that utilize roof mounted condensers), since heat transfer from the condenser is not dependent on a temperature of the outdoor environment. Technical advantages that apply to the ER condenser system 600, may also apply to the other subject matter described herein.

The amount of heat that the conductive members 648b, 648d can receive from the TECs 646a, 646b can be dependent on thermal conductivity between the first thermally conductive elements of the TECs 646a, 646b and adjacent surfaces of the conductive members 648b, 648d. Similarly, amounts of heat that can be extracted from conductive members 648a, 648c can be dependent on thermal conductivity between the second thermally conductive elements of the TECs 646a, 646b and adjacent surfaces of the conductive members 648a, 648c.

Figure 8:
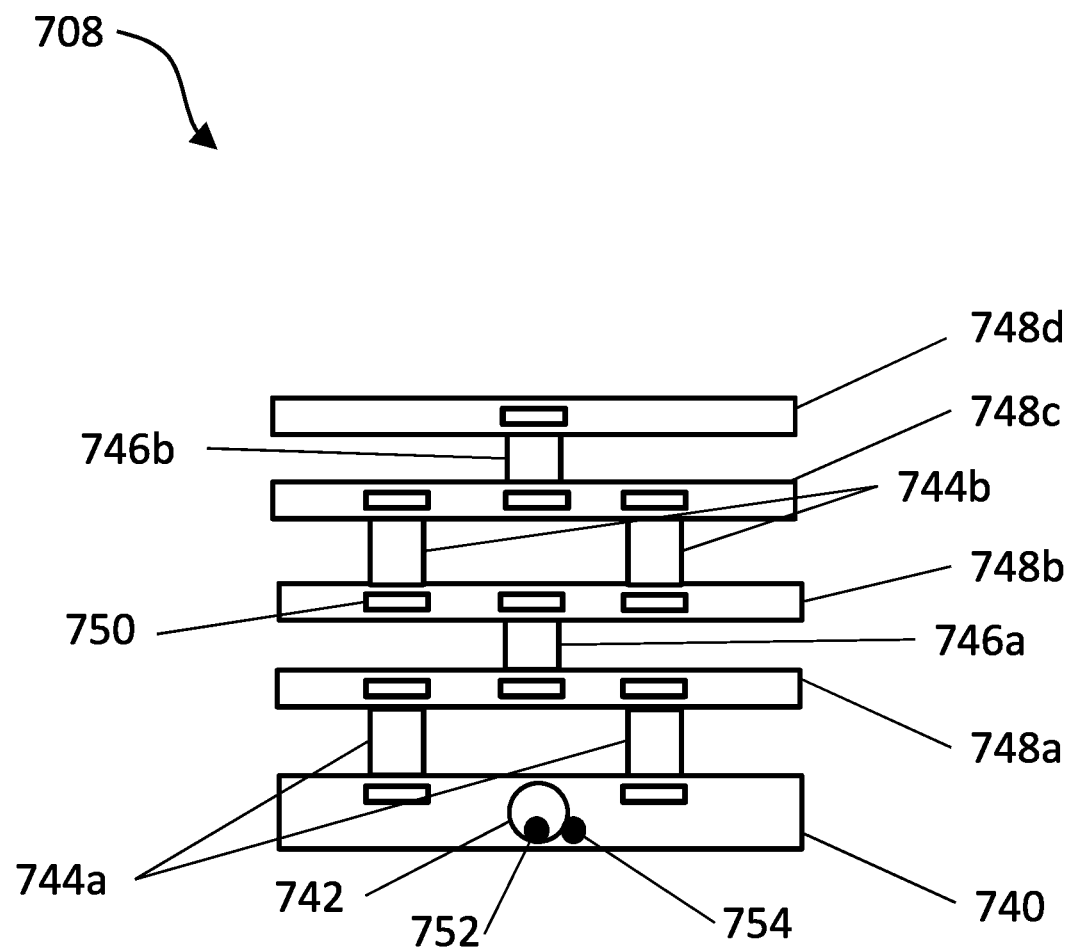
FIG. 8 is a diagram of another embodiment of a P-Gen condenser.

FIG. 8 shows another example of P-Gen condenser 708 that can be used within an ER condenser system (e.g., the ER condenser system 600 shown in FIG. 6), and can be used within a cooling system such as the cooling system 500, shown in FIG. 5. The condenser 708 can generally be similar to the P-Gen condenser 608, shown in FIGS. 7A-7B, but can include temperature sensors 750 that can be embedded within a condensing member 740 and within thermally conductive members 748a, 748b, 748c, 748d. The condenser 708 can include the condensing member 740, which can have a passage 742 extending therethrough, thermally conductive members 748a, 748b, 748c, 748d, first and second sets of TEGs 744a, 744b, first and second TECs 746a, 746b, and the temperature sensors 750. As shown in FIG. 8, the temperature sensors can be embedded within the condensing member 740, and within the conductive members 748a, 748b, 748c, 748d, adjacent to ends of the TEGs 744a, 744b and the TECs 746a, 746b. By embedding the temperature sensors 750 within the conductive members 748a, 748b, 748c, 748d, the sensors can measure temperature closer to the ends of the TEGs 744a, 744b and the TECs 746a, 746b. The P-Gen condenser 708 can also include temperature sensors 752, 754 that can be configured to measure the temperature of a refrigerant within the passage 742, and/or a temperature of the condensing member 740 adjacent to the passage 742. The temperature sensors 752, 754 can generally be similar to the temperature sensor 652, 654, described above, and can be coupled to the condensing member 740 and can be positioned within, and/or adjacent to, the passage 742 to measure the temperature of the refrigerant as it travels through the passage 742.

Figure 9:
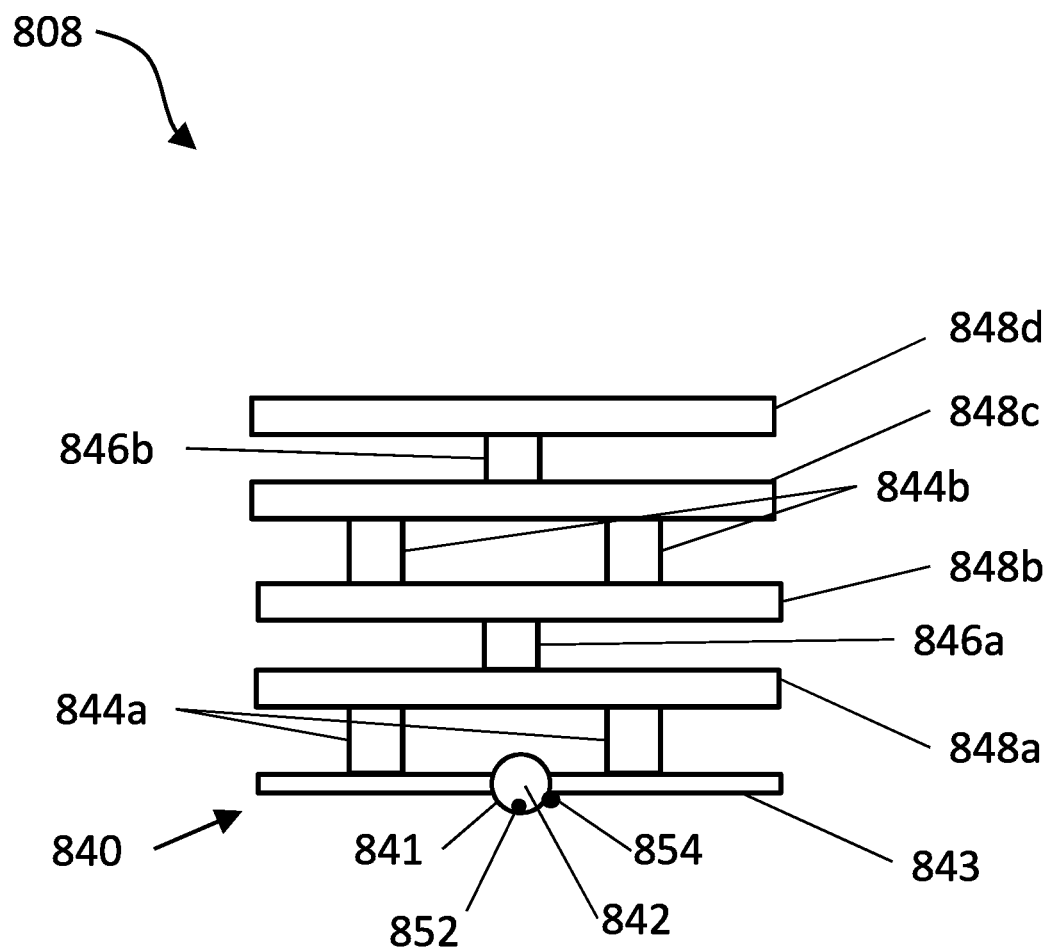
FIG. 9 is a diagram of an embodiment of a P-Gen condenser.

FIG. 9 shows another example of a P-Gen condenser 808. The condenser 808 can generally be similar to the P-Gen condenser 608, shown in FIGS. 7A-7B, but can have a condensing member 840 that can include a tube 841 having a passage 842 extending therethrough, the tube 841 having fins 843 extending from the tube 841. In some embodiments, the tube 841 and the fins can be made from a single piece of material. The condenser 808 can include the condensing member 840, thermally conductive members 848a, 848b, 848c, 848d, first and second sets of TEGs 844a, 844b, as well as first and second TECs 846a, 846b. The configuration of the condensing member 840 can reduce the cost of the condensing member 840. Additionally, the fins 843 can improve heat transfer from the refrigerant to the first thermally conductive elements of the first pair of TEGs 844a. The P-Gen condenser 808 can also include temperature sensors 852, 854 that can be configured to measure the temperature of a refrigerant within the passage 842, and/or a temperature of the condensing member 740 adjacent to the passage 842. The temperature sensors 852, 854 can generally be similar to the temperature sensor 652, 654, described above, and can be coupled to the condensing member 840 and can be positioned within, and/or adjacent to, the passage 842 to measure the temperature of the refrigerant as it travels through the passage 842.

Figure 10:
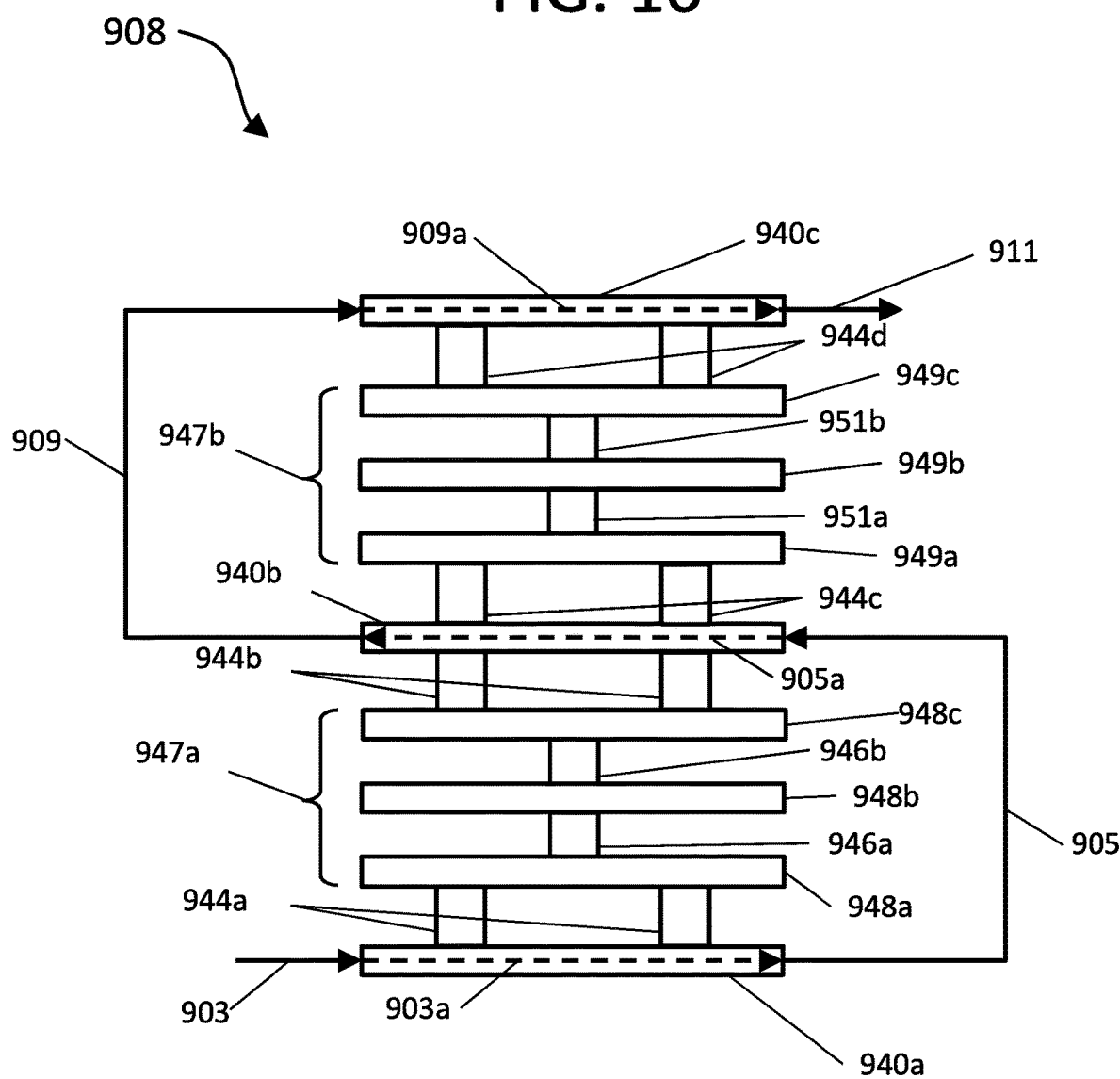
FIG. 10 is a side view of an embodiment of a multi-pass P-Gen condenser that can be used to recover energy from a refrigerant.

In some embodiments, a multi-pass P-Gen condenser 908 can be used to recover energy from a refrigerant 903, as shown in FIG. 10. The P-Gen condenser 908 can be part of a condenser system such as the condenser system 600 described above, and the condenser system can be used within a cooling system such as the cooling system 500, shown in FIG. 5. In some cases, a multi-pass P-Gen condenser can be used when retro-fitting existing condensers, which may have geometries conducive for creating a multi-pass P-Gen condenser. The P-Gen condenser 908 can include first, second and third condensing members 940a, 940b, 940c that can have passages extending therethrough. The condensing members 940a, 940b, 940c can generally be similar to the condensing members 640, 740 shown in FIGS. 7A and 8. In some embodiments, one or more of the condensing members 940a, 940b, 940c can be similar to the condensing member 840 shown in FIG. 9, and can include a tube having fins extending therefrom.

The P-Gen condenser 908 can include TEGs that can be coupled to the condensing members 940a, 940b, 940c, and can be configured convert thermal energy into electrical energy. In the illustrated example, the P-Gen condenser 908 includes first, second, third, and fourth, sets of TEGs 944a, 944b, 944c, 944d. The sets of TEGs 944a, 944b, 944c, 944d can generally be similar to the TEG 350, described above with regard to FIG. 3.

As described above with regard to the TEG 350, shown in FIG. 3, each of the TEGs 944a, 944b, 944c, 944d can include a first thermally conductive element, which can transfer heat to semiconductors within the TEGs 944a, 944b, 944c, 944d, and a second thermally conductive element, which can transfer heat away from semiconductors within the TEGs 944a, 944b, 944c, 944d, thereby generating a thermal gradient across the semiconductors. The thermal gradient can generate charge motion within the semiconductors. The charge motion can create a voltage potential across each semiconductor such that the TEGs 944a, 944b, 944c, 944d can generate electric power.

The P-Gen condenser 908 can also include first and second cooling stages 947a, 947b that can function to manage temperature gradients across semiconductors in the TEGs 944a, 944b, 944c, 944d. As shown in FIG. 10, the first cooling stage 947a can include first, second, and third thermally conductive members 948a, 948b, 948c, as well as first and second TECs 946a, 946b. The first TEC 946a can be position between the first and second thermally conductive members 948a, 948b, and the second TEC 946b can be positioned between the second and third thermally conductive members 948b, 948c. Similarly, the second cooling stage 947b can include first, second and third thermally conductive members 949a, 949b, 949c, as well as first and second TECs 951a, 951b. The TECs 946a, 946b, 951a, 951b can generally be similar to the TEC 450, described above with regard to FIG. 4. As an example, when retrofitting an existing condenser, TEGs 944a, 944b, 944c, 944d can be coupled to tubes and/or plates that form the first, second, and third condensing members 940a, 940b, 940c. The first cooling stage 947a can be positioned between the first and second condensing members 940a, 940b, and the second cooling stage 947b can be positioned between the second and third condensing members 940b, 940c, as shown in FIG. 10.

As described above with regard to the TEC 450, shown in FIG. 4, the TECs 946a, 946b, 951a, 951b can include first thermally conductive elements, which can be heated as current flows through the TECs 946a, 946b, 951a, 951b, and second thermally conductive elements, which can be cooled when current flows through the TECs 946a, 946b, 951a, 951b.

The TECs 946a, 946b of the first cooling stage 947a can be oriented such that when power is applied, heat is transferred from the first and third thermally conductive members 948a, 948c, to the second thermally conductive member 948b, thereby cooling the first and third thermally conductive members 948a, 948c. For example, the first TEC 946a can be oriented such that the second thermally conductive element of the TEC 946a is coupled to the first thermally conductive member 948a, and the second TEC 946b can be oriented such that the second thermally conductive element of the TEC 946b is coupled to the third thermally conductive member 948c. The first thermally conductive elements of the TECs 946a, 946b can be coupled to the second thermally conductive member 948b.

The TECs 951a, 951b of the second cooling stage 947b can be oriented such that when power is applied, heat is transferred from the first and third thermally conductive members 949a, 949c, to the second thermally conductive member 949b, thereby cooling the first and third thermally conductive members 949a, 949c. For example, the first TEC 951a can be oriented such that the second thermally conductive element of the TEC 951a is coupled to the first thermally conductive member 949a, and the second TEC 951b can be oriented such that the second thermally conductive element of the TEC 951b is coupled to the third thermally conductive member 949c. The first thermally conductive elements of the TECs 951a, 951b can be coupled to the second thermally conductive member 949b.

As shown in the illustrated example, the first set of TEGs 944a can be positioned between the first condensing member 940a and the first cooling stage 947a. The TEGs 944a can be oriented such that the first thermally conductive element is coupled to the first condensing member 940a, and the second thermally conductive element is coupled to the first thermally conductive member 948a of the first cooling stage 947a.

The second set of TEGs 944b can be positioned between the first cooling stage 947a and the second condensing member 940b. The TEGs 944b can be oriented such that the first thermally conductive element is coupled to the second condensing member 940b, and the second thermally conductive element is coupled to the third thermally conductive member 948c of the first cooling stage 947a.

The third set of TEGs 944c can be positioned between the second condensing member 940b and the second cooling stage 947b. The TEGs 944c can be oriented such that the first thermally conductive elements are coupled to the second condensing member 940b, and the second thermally conductive element is coupled to the first thermally conductive member 949a of the second cooling stage 947b.

The fourth set of TEGs 944d can be positioned between the second cooling stage 947b and the third condensing member 940c. The TEGs 944d can be oriented such that the first thermally conductive elements are coupled to the third condensing member 940c, and the second thermally conductive element is coupled to the third thermally conductive member 949c of the second cooling stage 947b.

In operation, the P-Gen condenser 908 can receive the refrigerant 903 from a compression system such as, e.g., the compression system 506 described above. The refrigerant 903a can flow through one or more passages of the first condensing member 940a, thereby transferring heat to the first condensing member 940a. Refrigerant 905 that exits the first condensing member 940a can be delivered to the second condensing member 940b. The refrigerant 905a can travel through one or more passages of the second condensing member 940b, thereby transferring heat to the second condensing member 940b. Refrigerant 909 that exits the second condensing member 940b can be delivered to the third condensing member 940c. The refrigerant 909a can travel through one or more passages of the third condensing member 940c, thereby transferring heat to the third condensing member 940c.

At least a portion of the heat that is transferred from the refrigerant 903a to the first condensing member 940a can be transferred to the first thermally conductive elements of the first set of TEGs 944a. At least a portion of the heat that is transferred from the refrigerant 905a to the second condensing member 940b can be transferred to the first thermally conductive elements of the second and third sets of TEGs 944b, 944c. At least a portion of the heat that is transferred from the refrigerant 909a to the third condensing member 940c can be transferred to the first thermally conductive elements of the fourth set of TEGs 944d.

In some cases, heat transferred to the TEGs 944a, 944b, 944c, 944d can be sufficient to create a temperature gradient across the semiconductors of the TEGs 944a, 944b, 944c, 944d such that the TEGs 944a, 944b, 944c, 944d can generate electric power. However, in order to improve the efficiency of the TEGs 944a, 944b, 944c, 944d, the TECs 946a, 946b, 951a, 951b can be used to control the temperature gradients across the semiconductors of the TEGs 944a, 944b, 944c, 944d. For example, a power management module (e.g., power management module 630) can deliver power to the first and second TECs 946a, 946b of the first cooling stage 947a, thereby heating the first thermally conductive elements of the TECs, 946a, 946b, which can be coupled to the second thermally conductive member 948b of the first cooling stage 947a, and cooling the second thermally conductive elements of the TECs 946a, 946b, which can be coupled to the first and third thermally conductive members 948a, 948c of the first cooling stage 947a, respectively. Therefore, heat can be transferred from the first and third thermally conductive members 948a, 948c to the TECs 946a, 946b, and heat can be transferred from the TECs 946a, 946b to the second thermally conductive member 948b. Accordingly, the first and third thermally conductive members 948a, 948c can be cooled by the TECs 946a, 946b. The first and third thermally conductive members 948a, 948c can be cooled such that they have temperatures that are less than the temperatures of the first and second condensing members 940a, 940b, respectively. Therefore, the first and third thermally conductive members 948a, 948c can function as heat sinks for the first and second sets of TEGs 944a, 944b. For example, heat can be transferred from the second thermally conductive elements of the TEGs 944a, 944b to the first and third thermally conductive members 948a, 948c, thereby creating a temperature gradient across the semiconductors of the TEGs 944a, 944b.

Similarly, the power management module (e.g. power management module 630) can deliver power to the first and second TECs 951a, 951b, of the second cooling stage 947b, thereby heating the first thermally conductive elements of the TECs, 951a, 951b, which can be coupled to the second thermally conductive member 949b of the second cooling stage 947b, and cooling the second thermally conductive elements of the TECs 951a, 951b, which can be coupled to the first and third thermally conductive members 949a, 949c of the second cooling stage 947b, respectively. Therefore, heat can be transferred from the first and third thermally conductive members 949a, 949c to the TECs 951a, 951b, and heat can be transferred from the TECs 951a, 951b to the second thermally conductive member 949b. Accordingly, the first and third thermally conductive members 949a, 949c can be cooled by the TECs 951a, 951b. The first and third thermally conductive members 949a, 949c can be cooled such that they have temperatures that are less than the temperatures of the second and third condensing members 940b, 940c, respectively. Therefore, the first and third thermally conductive members 949a, 949c can function as heat sinks for the third and fourth sets of TEGs 944c, 944d. For example, heat can be transferred from the second thermally conductive elements of the TEGs 944c, 944d to the first and third thermally conductive members 949a, 949c, thereby creating a temperature gradient across the semiconductors of the TEGs 944a, 944b.

The power management module can control the amount of power delivered to each of the TECs 946a, 946b, 951a, 951b, as described above with regard to the condenser system 600. The power management module can adjust the temperature gradient across the semiconductors of the TEGs 944a, 944b, 944c, 944d by changing the amount of electric power that is delivered to the TECs 946a, 946b, 951a, 951b. For example, to increase the temperature gradients across the semiconductors of the TEGs 944a, 944b, 944c, 944d, the power management module can deliver more power to the TECs 946a, 946b, 951a, 951b, thereby increasing the amount of heat drawn from the thermally conductive members 948a, 948c, 949a, 949c. Alternatively, to increase the temperature gradients across the semiconductors of the TEGs 944a, 944b, 944c, 944d, the power management module reduce the amount of power delivered to the TECs 946a, 946b, 951a, 951b, thereby decreasing the amount of heat drawn from the thermally conductive members 948a, 948c, 949a, 949c.

As described above, the TEGs 944a, 944b, 944c, 944d can generate electric power as a result of temperature gradients that form within the semiconductors of the TEGs 944a, 944b, 944c, 944d. The P-Gen condenser 908 can include temperature sensors that can be configured to measure temperatures of the refrigerant within the passageways of the condensing members 940a, 940b, 940c, as well as temperatures other components of the P-Gen condenser 908. For example, the P-Gen condenser 908 can include temperature sensors that can be (e.g., temperature sensors 652, 654) that can be positioned within, and/or adjacent to, the passages in the condensing members 940a, 940b, 940c. The P-Gen condenser 908 can also include temperature sensors (e.g. temperature sensors 650) that can be position adjacent to the TEGs 944a, 944b, 944c, 944d and/or TECs 946a, 946b, 951a, 951b as described above with regard to the P-Gen condenser 608 illustrated in FIG. 7B. As another example, the P-Gen condenser 908 can include temperature sensors (e.g. temperature sensors 750) that can be positioned within the thermally conductive members 948a, 948b, 948c of the first cooling stage 947a, and within the thermally conductive members 949a, 949b, 949c of the second cooling stage 947b, as described above with regard to the P-Gen condensers 608, 708. The sensors can be powered, monitored, and/or controlled by a thermal management module (e.g. the thermal management module 632). The thermal management module can be in electronic communication with the power management module as described above with regard to the condenser system 600. Similarly, the power management module can receive and/or distribute the electric power generated by the TEGs 944a, 944b, 944c, 944d, as described above with regard to the condenser system 600.

As the refrigerant 903a, 905a, 909a, travels through first, second and third condensing members 940a, 940b, 940c, the amount of heat that is removed from the refrigerant 903a, 905a, 909a can be controlled based on temperatures measured by the temperature sensors such the temperature of the refrigerant 911 that exits the P-Gen condenser can be controlled. For example, the amount of power delivered to the TECs can be controlled such that the temperature of the refrigerant 903a, 905a, 909a can be reduced by specified amounts as it travels through the first, second, and third condensing members 940a, 940b, 940c.

In some embodiments, TEGs and/or TECs of a P-Gen condenser can be mechanically loaded to increase their efficiencies. For example, opposing forces can be applied to the first and second thermally conductive elements (e.g., the first and second thermally conductive elements 302, 304 of the TEG 350, and the first and second thermally conductive elements 402, 404 of the TEC 450) such that the semiconductors of the TEGs and/or TECs are compressed.

Loading the semiconductors can increase electron/hole mobility within the semiconductors, thereby increasing the efficiency of the TEGs and/or TECs when in operation. In some cases, loading the TEGs and/or TECs can decrease thermal and/or electrical resistivity between the components of the TEGs and/or TECs. For example, loading the TEGs and/or TECs can reduce electrical resistivity between semiconductors and conductive members (e.g., conductive members 356, 358, 360 of the TEG 350, and conductive members 456, 458, 460 of the TEC 450). Loading the TEGs and/or TECs can also reduce thermal resistivity between the thermally conductive elements, the conductive members, and the semiconductors of the TEGs and/or TECs.

In some embodiments, a P-Gen condenser of a condenser system can be mechanically loaded. For example, with reference to the P-Gen condenser 608, shown in FIG. 7A, opposing loads can be applied to the condensing member 640 and the thermally conductive member 648d such that the TEGs 644a, 644b and TECs 646a, 646b are compressed therebetween. Loading the P-Gen condenser can reduce thermal resistivity between the condensing member 640 and the TEGs 644a, as well as reducing thermal resistivity between the thermally conductive members 648a, 648b, 648c, 648d and the TEGS 644a, 644b and/or TECs 646a, 646b. Reducing thermal resistivity between the components of the P-Gen condenser 608 can increase heat transfer, and increase efficiency of the TEGS 644a, 644b and/or TECs 646a, 646b. In some embodiments, load on the P-Gen condenser can be used to control thermal gradients within the TEGS 644a, 644b and/or TECs 646a, 646b. The mechanical loading can also increase electron/hole mobility within the semiconductors, thereby increasing the efficiency of the TEGs 644a, 644b and/or TECs 646a, 646b when in operation, as described above.

In some embodiments, mechanical loading of TEGs, TECs, and/or P-Gen condensers can be actively controlled to optimize performance of the P-Gen condenser during operation. For example, load on individual TEGs and TECs, and/or on portions of the P-Gen condenser can be controlled. In some cases, the load can be adjusted to maximize efficiency of the P-Gen condenser. In other cases, the load can be adjusted to maximize effectiveness (e.g., heat extraction) of the P-Gen condenser. As an example, a feedback control system can be implemented to optimize efficiency and/or effectiveness of the P-Gen condenser.

Figure 14:
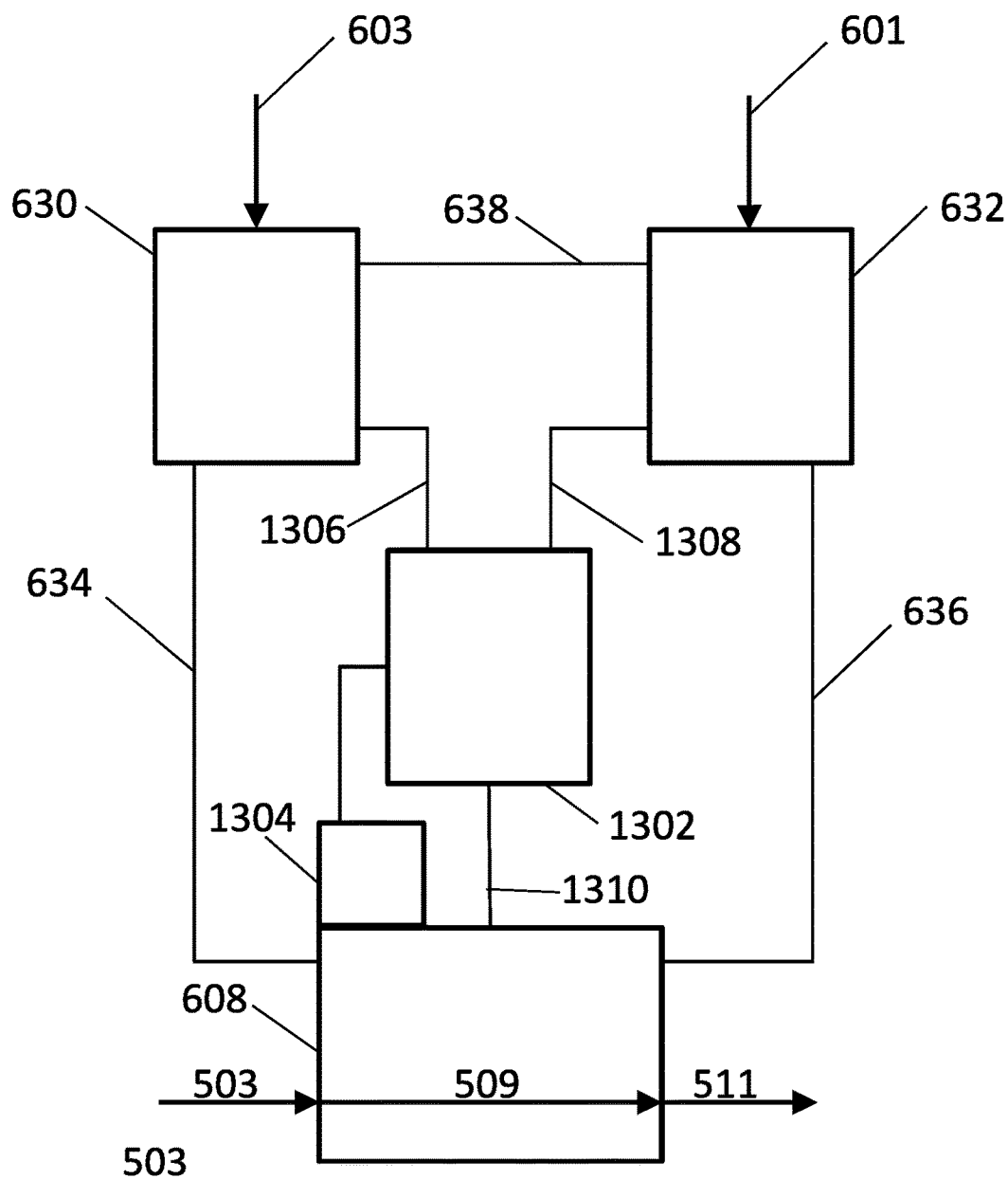
FIG. 14 shows an example of an ER condenser system that includes a controller that can be configured to manage loads applied to TEGs and TECs of a P-Gen condenser.

FIG. 14 shows an example of an ER condenser system 1300 that includes a controller 1302 that can be configured to manage loads applied to TEGs and TECs of a P-Gen condenser 608. The condenser system 1300 can generally be similar to the condenser system 600, but can include the controller 1302 and a mechanical loading system 1304 configured to apply mechanical loads to TEGs and TECs of the P-Gen condenser. The controller 1302 can be electrically coupled to a power management module 630, a thermal management module 632, and the P-Gen condenser 608, e.g., via couplings 1306, 1308, 1310. During operation, the thermal management module 632 can monitor temperatures of various locations of the P-Gen condenser 608, and can communicate with the power management module 630 to control how much power is delivered to TECs 646a, 646b to optimize efficiency of TEGs 644a, 644b. In some cases, rather than adjusting power delivered to the TECs 646a, 646b, a mechanical force applied to the TECs 646a, 646b, can be adjusted. As an example, the power management module 630 can receive instruction from the thermal management module 632 indicating that cooling effects provided by the TECs 646a, 646b should be altered (e.g., increased or decreased).

In some cases, power delivered to the TECs 646a, 646b can be adjusted (e.g., increased or decreased) to alter the cooling effects provided by the TECs 646a, 646b. Alternatively, rather than increasing power delivered to the TECs 646a, 646b, a mechanical force applied to the TECs 646a, 646b can be altered (e.g., increased or decreased). As an example, the power management module 630 can generate instructions characterizing loads to be applied to the TECs 646a, 646b, and can deliver the instructions to the controller 1302. In some cases, the TECs 646a, 646b can be calibrated to determine effects of mechanical loading on the efficiency of the TECs 646a, 646b. Therefore, mechanical loading can be correlated with an effective increase in power delivered to the TECs 646a, 646b. The controller 1302 can receive the instructions from the power management module 630 and can generate instructions characterizing loads to be applied to the TECs 646a, 646b. The controller 1302 can deliver the instructions to the mechanical loading system 1304, which can apply the load to the TECs 646a, 646b.

In some cases, the controller 1302 can monitor power generated by the TEGs 644a, 644b, and can be configured to adjust automatically adjust mechanical loads applied to the TEGs 644a, 644b to maximix efficiency of the TEGs 644a, 644b. For example, the controller 1302 can deliver instructions to the mechanical loading system 1304 to increase force applied to the TEGs 644a, 644b. The controller 1304 can monitor the power output from the TEGs 644a, 644b. If the load change increases power output from the TEGs 644a, 644b, the process can be repeated until a designated maximum acceptable load has been achieved, or until increasing loads on the TEGs 644a, 644b does not increase power output. Alternatively, if increasing loads on the TEGs 644a, 644b reduces power output from the TEGs 644a, 644b, the controller 1302 can deliver instructions to the mechanical loading system 1304 to reduce the load applied to the TEGs 644a, 644b. The process can be repeated until power output from the TEGs 644a, 644b no longer changes, changes less than a predetermined amount, with decreasing load, or until a minimum predetermine load has been achieved. Each of the cooling systems described herein that can operate using the condenser system 600 can also operate using the condenser system 1300.

Figure 11:
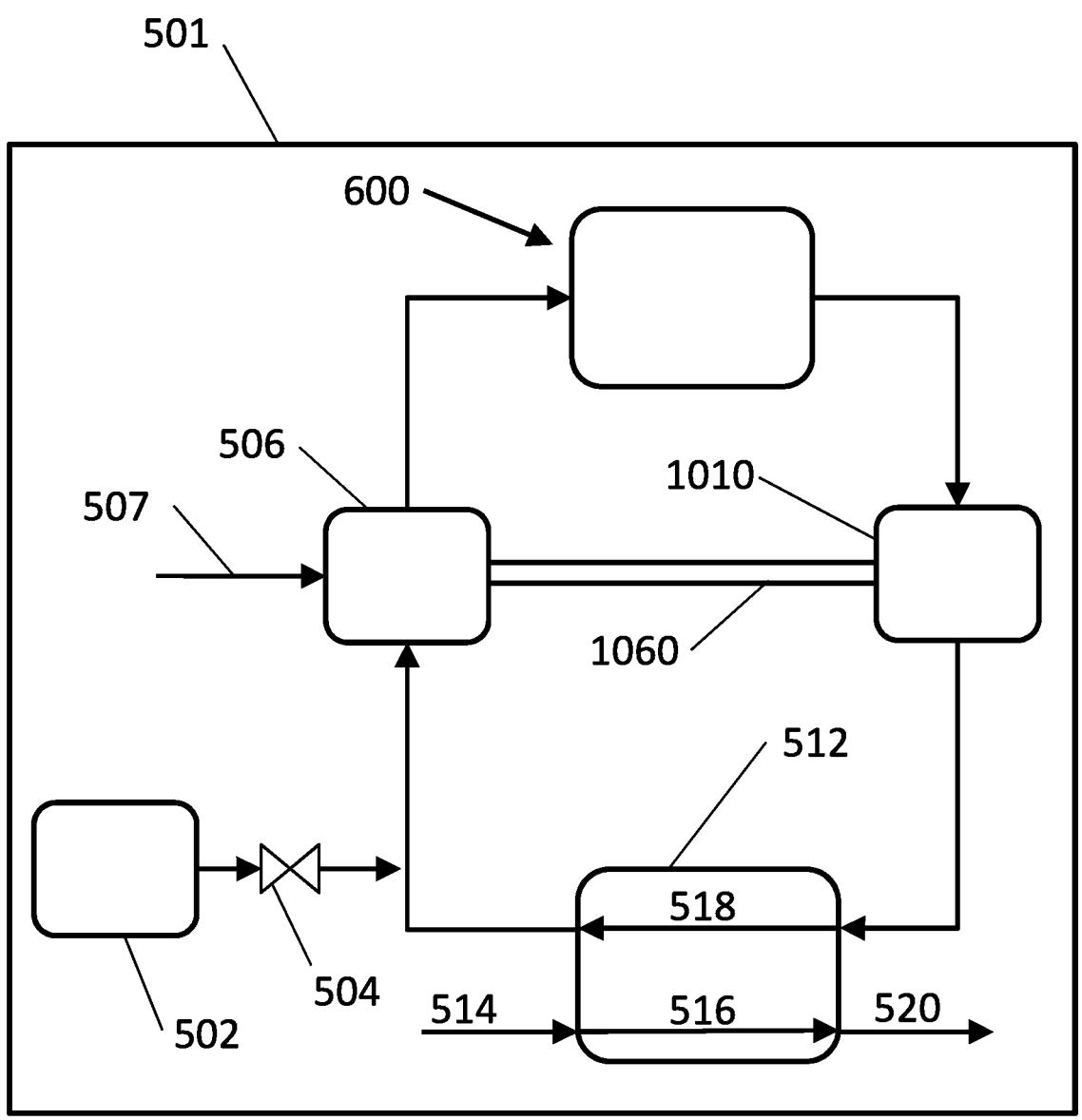
FIG. 11 is a diagram of an embodiment of a cooling system that includes an energy recovering (ER) condenser system and a scroll expander.

In some embodiments, cooling systems can utilize one or more scroll expanders, rather than using an expansion valve (e.g., expansion valves 110, 510), to reduce pressure of a refrigerant. FIG. 11 shows a cooling system 1000 that can generally be similar to the cooling system 500, but can include a scroll expander 1010. The scroll expander 1010 can be configured to facilitate recovering energy associated with expansion of a refrigerant. In some embodiments, the scroll expander 1010 can be made from a scroll compressor. For example, a portion of a scroll compressor can be cut to form the scroll expander 1010.

Initially, low-pressure, low-temperature refrigerant vapor can be delivered to a compression system 506. The compressors can be driven by electric motors that can receive electric power 507 from an external power source. When the refrigerant leaves the compression system 506, it can be in a high-temperature, high-pressure, vapor state. The refrigerant can subsequently flow to a P-Gen condenser (e.g., P-Gen condenser 608) of the condenser system 600 downstream of the compression system 506. The condenser system 600 can facilitate a phase change of the refrigerant from vapor, or mostly vapor, to a predominantly liquid state by removing excess heat generated during the compression process. Once at least a portion of the refrigerant is in a condensed state it can travel through the scroll expander 1010, which can create a pressure drop that can put at least a portion of the refrigerant in a low-pressure, low-temperature, liquid state.

The scroll expander can include two interleaved scrolls, which can facilitate reducing pressure of the refrigerant. For example, a first scroll can be fixed, which a second scroll can orbit the second scroll eccentrically, without rotating, thereby reducing the pressure of refrigerant as it travels between the scrolls. The second scroll can be mechanically coupled to compressors of the compression system 506 (e.g., via coupling element 1060), such that mechanical energy from the orbital motion of the second scroll can be captured and utilized to drive the compressors, thereby increasing the efficiency of the cooling system 1000. The liquid refrigerant can be then delivered to a heat exchanger 512 (e.g., an evaporator) to cool incoming air 514 from a data center environment. As the air 516 travels through the heat exchanger it can be cooled by exchanging heat with the refrigerant 518 traveling through the heat exchanger 512. The air 520 can then be released from the heat exchanger 512 to cool the data center.

Figure 12:
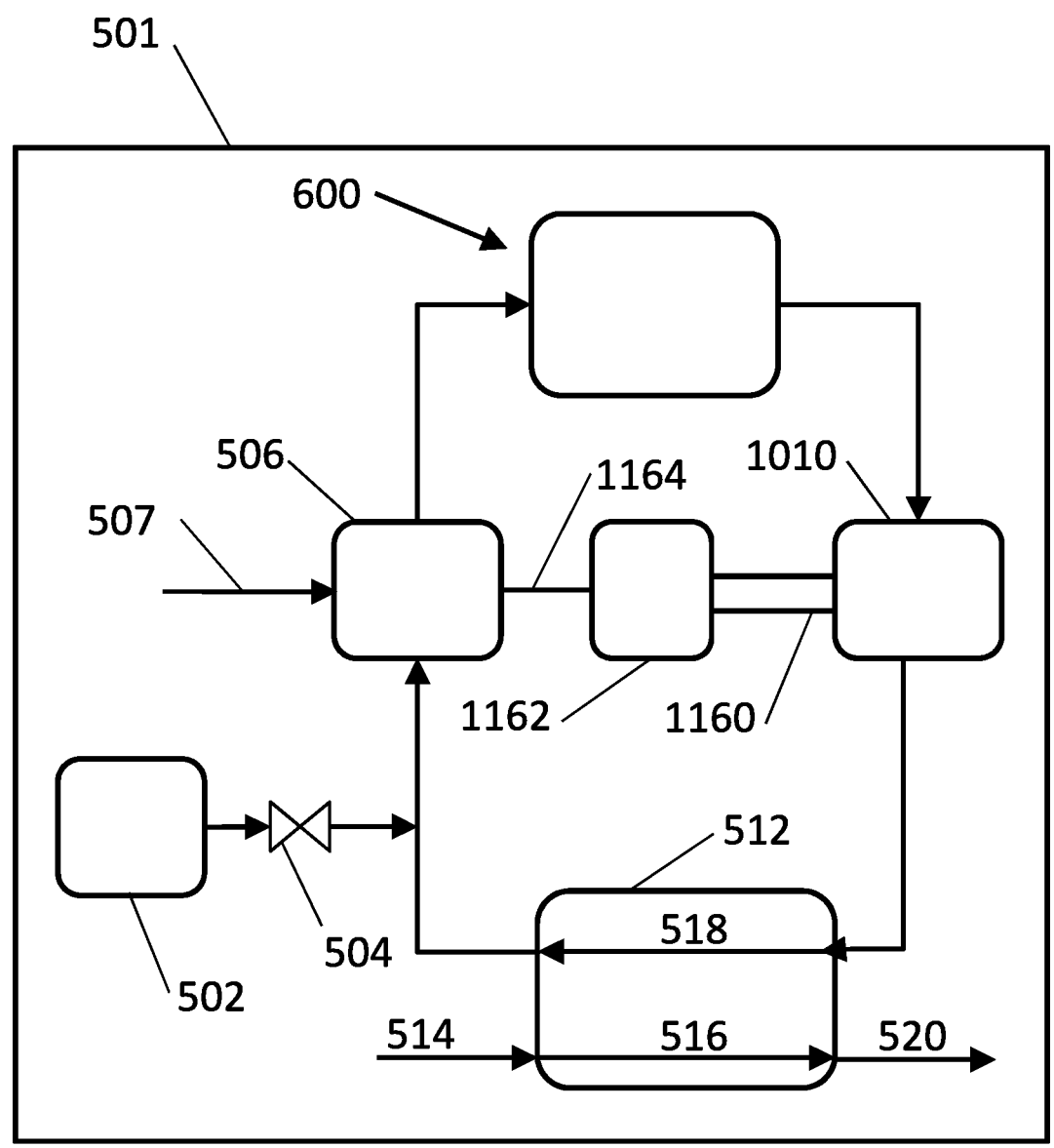
FIG. 12 is a diagram of another embodiment of a cooling system that includes an energy recovering (ER) condenser system and a scroll expander.

In some embodiments, mechanical energy from orbital motion of a scroll of a scroll expander can be converted to electrical energy, which can be use do power various components of a cooling system. FIG. 12 shows a cooling system 1100 that can generally be similar to the cooling system 1000 shown in FIG. 11, but can include a direct current (DC) generator 1162 coupled to the scroll expander 1010 via a coupling element 1160. Mechanical energy from orbital motion of the second scroll of the scroll expander 1010 can be delivered to the DC generator 1162 via the coupling element 1160. The DC generator can be electrically coupled to the compression system 506 via coupling element 1164. As an example, the DC generator can convert mechanical energy from the scroll expander 1010 to electrical energy, and can provide electric power to the compression system 506 to power compressors of the compression system 506 via the coupling element 1164. The electric power from the DC generator 1162 can supplement, or replace, the electric power 507 from the external power source.

Figure 13:
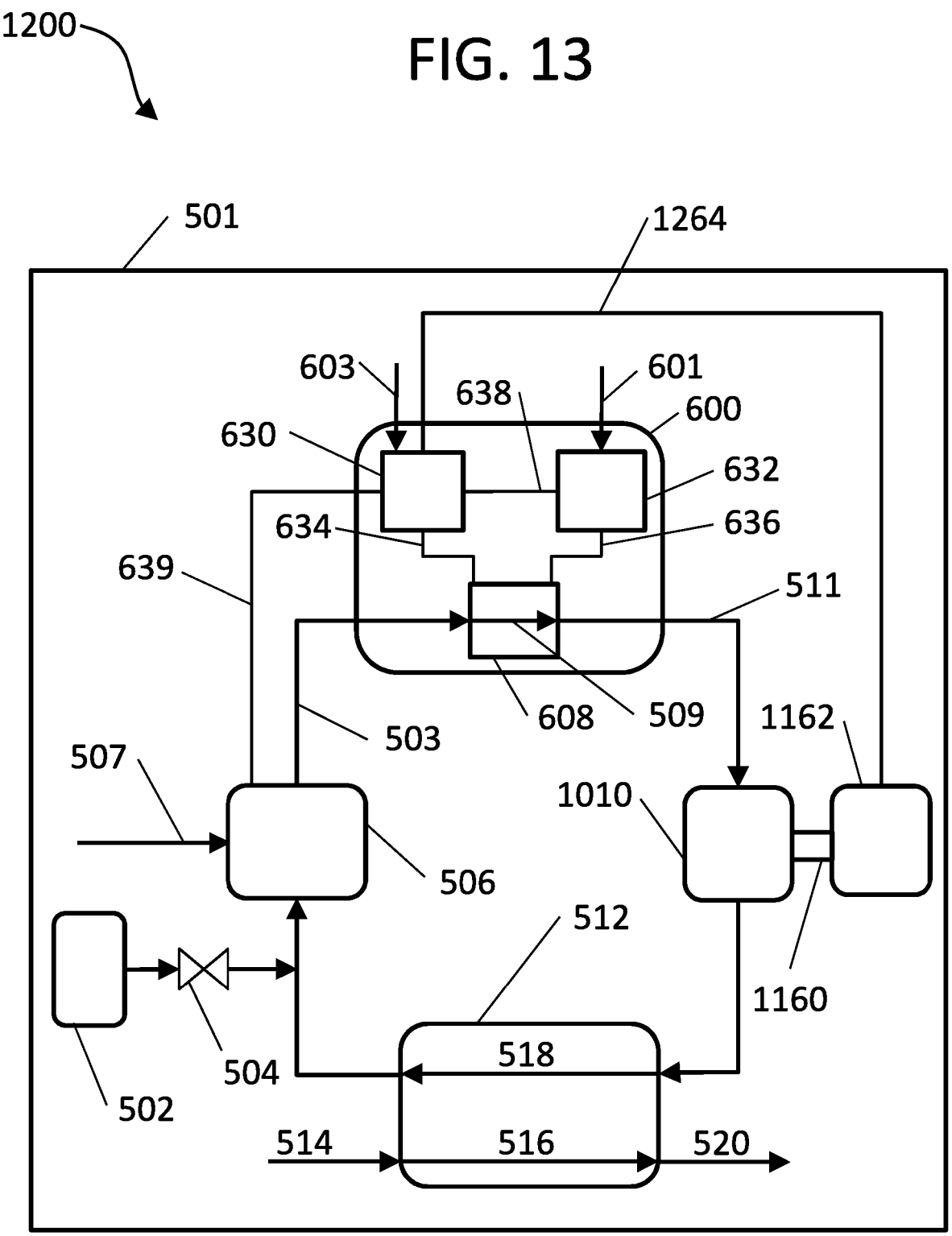
FIG. 13 is a diagram of another embodiment of a cooling system that includes an energy recovering (ER) condenser system and a scroll expander.

Alternatively, in some embodiments, power from the DC generator 1162 can be delivered to the power management module 630, as illustrated in an embodiment of a cooling system 1200, shown in FIG. 13. The cooling system 1200 shown in FIG. 13 can generally be similar to the cooling system 1100 shown in FIG. 11, but the DC generator 1162 can be electrically coupled to the power management module 630 via a coupling element 1264. Electric power from the DC generator 1162 can be delivered to the power management module 630. As an example, electrical energy corresponding to the electric power can be stored within batteries. In some embodiments, the power management 630 module can deliver a portion of the electric power to the TECs 646a, 646b to power them. Additionally, power management module 630 can deliver a portion of the electrical energy to the compression system 506 (e.g., via coupling element 639) to power the compressors.

Exemplary technical effects of the subject matter described herein include the ability to convert waste heat into electrical power, thereby increasing the efficiency of a cooling system. Additionally, the subject matter described herein can allow all of the components of a cooling system to be located in the same general vicinity since there will be less waste heat to manage. The design of cooling system can be simplified since waste heat does not need to be released into the environment. This can enable constructing data centers in buildings or locations that would otherwise not be viable options due to complex construction requirement and/or costs associated with constructing and maintaining the data center. The subject matter described herein can facilitate design of cooling systems that do no exchange heat directly with an external environment. Therefore, the cooling systems can be more efficient and stable than other cooling systems (e.g., cooling system that utilize roof mounted condensers), since heat transfer from condensers is not dependent on a temperature of the outdoor environment. One skilled in the art will understand that the subject matter described herein is not limited to application within data centers, and can be applied within any refrigeration system to manage waste heat.

Some implementations of the current subject matter can be used for recovering waste heat from industrial facilities that generate large amounts of heat. For example, the following description includes an implementation of the energy recovery system to generate electric power using waste heat from cement kilns.

Cement kilns can be used for the pyroprocessing stage of manufacturing various types of cements, in which calcium carbonate reacts with silica-bearing minerals to form a mixture of calcium silicate. During the pyroprocessing state, cement kilns dissipate a substantial amount of heat through the kiln walls, which is rejected to outside ambient air. Accordingly, there is energy that is vented as waste heat.

An aspect of the present disclosure provides a system that may recuperate heat dissipating from a kiln to generate electrical power using thermoelectric generators (TEGs), which may convert heat into electrical energy. The TEGs may generate electrical energy as a result of temperature gradients within the TEGs. A portion of the heat from the kiln may be delivered to one or more TEGs, thereby creating the temperature gradient, and the TEGs may generate electrical energy. To improve the power output and/or the efficiency of the TEGs, one or more thermoelectric coolers (TECs) may be included to manage the temperature gradients within the TEGs. By recuperating the dissipating heat, which would otherwise be wasted, and converting it to electrical energy, overall energy consumption can be reduce. The generated electricity may be put back to the kiln system to operate various electrical systems, stored in various energy/electricity storage systems, e.g., batteries, and/or supplied to conventional grid electricity. In another aspect of the present disclosure, the system can provide a temperature monitoring of the kiln surface. By monitoring the kiln surface temperature, operation safety can be improved. Further, the TEGs may be operated to provide a cooling to the kiln surface. For example, cooling of the kiln surface may be activated when the kiln surface is overheated, and thereby improving the safety. Cooling the kiln surface by the TEGs may reduce required time to cool down the kiln for maintenance purposes, operational purposes, or due to a malfunction.

In some implementations, rather than using TECs to manage temperature gradients within the TEGs, other heat removal devices may be used. For example, a combination of fans and heat sinks may be used to provide controlled forced convection to manage the temperature gradients within the TEGs.

A typical process of manufacturing cement includes grinding a mixture of limestone and clay or shale to make a fine "rawmix," heating the rawmix to sintering temperature (up to about 1450° C.) in a cement kiln, and grinding the resulting clinker to make cement. In the heating stage, the rawmix is fed into a kiln and gradually heated by contact with the hot gasses from combustion of the kiln fuel. Typically, a peak temperature of 1400-1450° C. is required to complete the reaction. The partial melting causes the material to aggregate into lumps or nodules, typically of diameter of 1-10 mm, which is called "clinker." The hot clinker next falls into a cooler, which recovers most of its heat, and cools the clinker to around 100° C., at which temperature it can be conveniently conveyed to storage.

Figure 15:
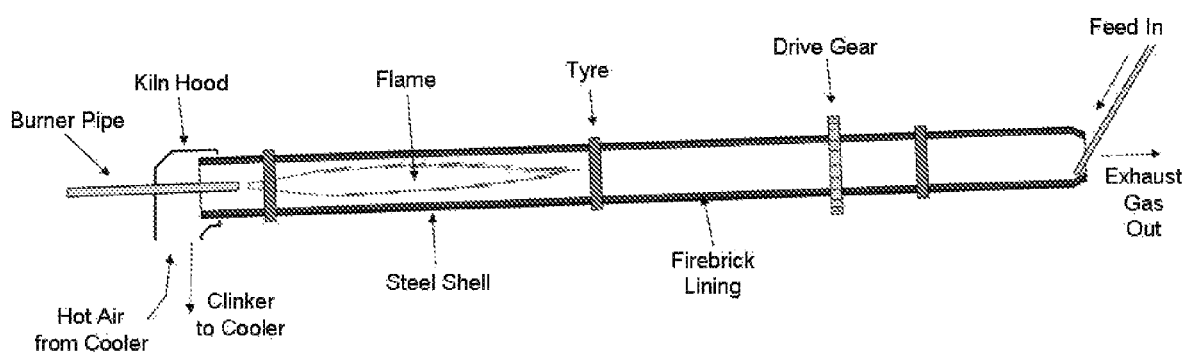
FIG. 15 is a cross-sectional view illustrating an example of cement kilns in the related art.

Some cement kiln systems are designed to accomplish these processes. The cement kilns can have (e.g., include) a circular cylindrical shape and can be rotated about the central axis of the cylindrical shape to facilitate mixing of the reactants. This type of kiln can also be referred to as a rotary kiln. FIG. 15 is a cross-sectional view illustrating an example cement kiln system that may perform this process.

In some implementations, an example waste heat recovery system may include at least one thermoelectric generator (TEG), and at least one thermoelectric cooler (TEC). TEGs, which may also be referred to as Seebeck generators, may be solid state devices that convert a heat flux (temperature difference) into electrical energy by taking advantage of the Seebeck effect. One side of a TEG may be coupled to a hot surface, and the other side may be coupled to a cold surface. TECs, which may be referred to as Peltier devices, Peltier heat pumps, and solid state refrigerators, may receive a DC electric current, and may utilize energy in the electric current to transfer heat from one side of the device to the other side of the device. TEGs may be used to convert heat to electric power. However, the efficiency of TEGs may be sensitive to thermal gradients across semiconductors used within the TEGs. Therefore, TECs may be used to manage temperature gradients across semiconductors in the TEGs.

Figure 16:
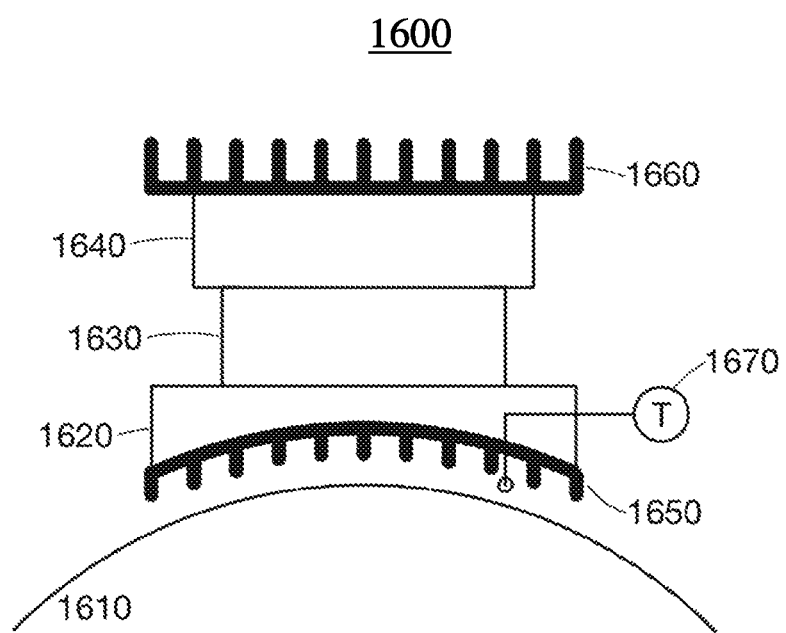
FIG. 16 is a cross-sectional diagram illustrating a waste heat recovery system according to an exemplary implementation of the present disclosure.

FIG. 16 is a cross-sectional view illustrating an exemplary implementation of a waste heat recovery system 1600 using waste heat from cement kilns. The waste heat recovery system 1600 may surround a heat source 1610. In implementations, the heat source 1610 may have a substantially cylindrical shape. The heat source 1610 may include a cement kiln. The waste heat recovery system 1600 may include a base block 1620 disposed around the heat source 1610. The base block 1620 may include (e.g., be made of) anodized aluminum, aluminum, aluminum alloys, copper, copper alloys, or the like. The material for the base block 1620 is not limited thereto, but may include other materials that generally have a high thermal conductivity, a high temperature operability, a corrosion resistance, and the like. A thermoelectric generator (TEG) module 1630 having a first end and a second end, in which the first end of the TEG module 1630 is thermally coupled to the base block 1620 and configured to receive at least a portion of the heat dissipated from the heat source 1610. A thermoelectric cooler (TEC) module 1640 can include a third end and a fourth end, in which the third end of the TEC 1640 is thermally coupled to the second end of the TEG module 1630. The TEC module 1640 may receive an electric power, which may cause the third end of the TEC module 1640 to cool and the fourth end of the TEC module 1640 to heat such that the third end of the TEC module 1640 may extract (e.g., receive; conduct) heat from the second end of the TEG module 1630.

Figure 17:
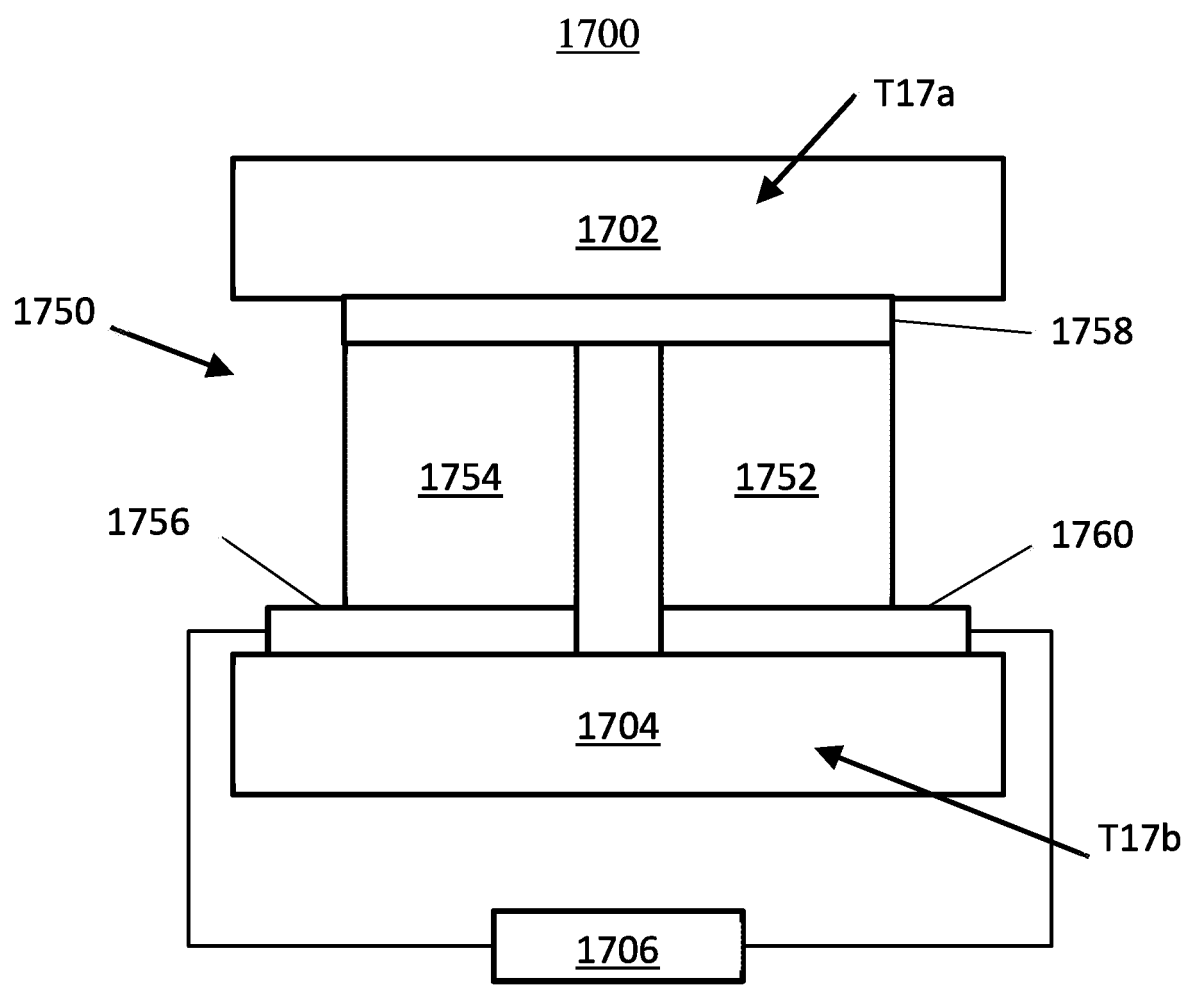
FIG. 17 is a cross-sectional diagram of a thermoelectric generator (TEG) module according to an exemplary implementation of the present disclosure.

FIG. 17 shows an example of the TEG module 1630 that may include a TEG 1750. The TEG module 1630 may include the TEG 1750, and a load 1706. The TEG 1750 may include a first thermally conductive element 1702, which may be referred to as a "hot member" on a first end of the TEG 1750, and a second thermally conductive element 1704, which may be referred to as a "cold member" on a second end of the TEG 1750. The TEG 1750 may include at least one n-type semiconductor 1752 and at least one p-type semiconductor 1754 that may be disposed between the first thermally conductive element 1702 and the second thermally conductive element 1704 and may be coupled in series by a number of conductive members. The illustrated implementation shows first, second, and third conductive members 1756, 1758, 1760. The first conductive member 1756 may be coupled to a first end of the p-type semiconductor 354, the third conductive member 1760 may be coupled to a first end of the n-type semiconductor, and the second conductive member 1758 may be coupled to second ends of the p-type and n-type semiconductors 1754, 1752 such that the p-type semiconductor 1754 and the n-type semiconductor 1752 may be coupled in series. The first and third conductive members 1756, 1760 may be electrically coupled to a load 1706 such that power may be delivered to the load 1706 from the TEG 1750. The load 1706 may include an electrical circuit, device, or system to supply the generated electric power back to the kiln system to operate various electrical components, various energy/electricity storage systems such as batteries, and/or an electrical circuit or system to supply the generated electricity to conventional grid electricity. However, the load 1706 is not limited thereto, and the load 1706 may include any device or system that can utilize the generated electricity.

In operation, the first thermally conductive element 1702 may receive heat from an external heat source such that it may be at a temperature T17a, and the second thermally conductive element 1704 may be at a temperature T17b, where T17a>T17b. In some embodiments, heat may be extracted from the second thermally conductive element 1704 to ensure that T17a>T17b. The first thermally conductive element 1702 and the second thermally conductive element 1704 may create thermal gradients across the p-type semiconductor 1754 and the n-type semiconductor 1752, which may cause majority charge carriers in the p-type semiconductor 1754 and the n-type semiconductor 1752 to move away from the first thermally conductive element 1702 and toward the second thermally conductive element 1704, and may cause minority charge carriers to move in the opposite direction. Accordingly, electrons in the n-type semiconductor 1752 may move toward the second thermally conductive element 1704, and positively charged "holes" in the p-type semiconductor 1754 may move toward the second thermally conductive element 1704. This charge motion may create a voltage potential across each semiconductor 1752, 1754. Since the semiconductors 1752, 1754 are coupled in series within a circuit, current may flow. Therefore, electrons may travel from the n-type semiconductor 1752, through the third conductive member 1760, through the load 1706, to the first conductive member 1756, through the p-type semiconductor 1754, to the second conductive member 1758, and back to the n-type semiconductor 1752 to complete the circuit. Therefore, the TEG 1750 may generate electric power, which may be delivered from the TEG 1750 to the load 1706. By adjusting the amount of heat that is delivered to the first thermally conductive element 1702 and/or the amount of heat that is extracted from the second thermally conductive element 1704, the temperature gradients across the semiconductors 1752, 1754 may be adjusted, efficiency and/or output power of the TEG may be optimized, and power generation may be adjusted.

Figure 18:
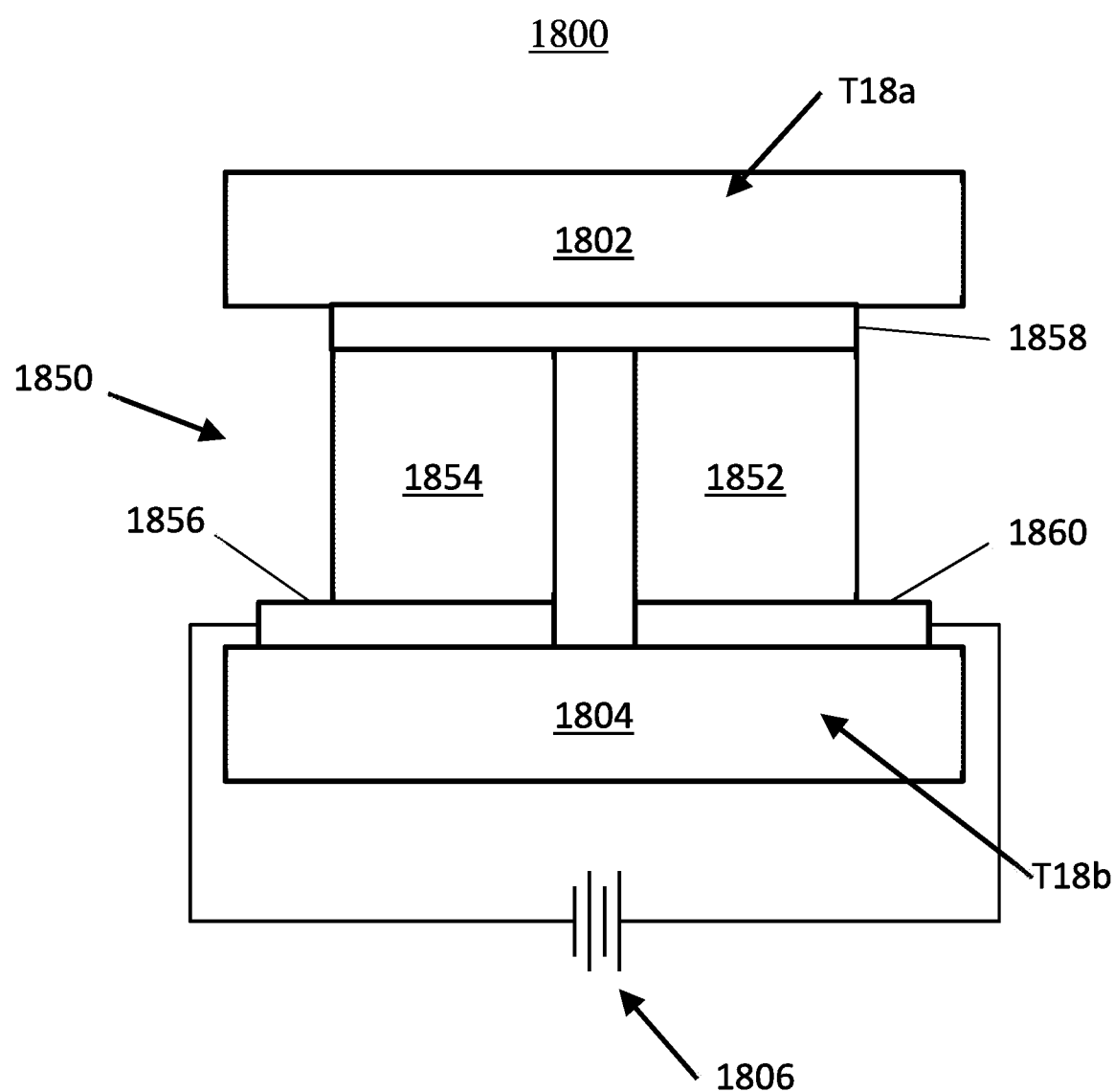
FIG. 18 is a cross-sectional diagram of a thermoelectric cooler (TEC) module according to an exemplary implementation of the present disclosure.

FIG. 18 is a cross-sectional diagram illustrating an example of the TEC module 1640 that may include a TEC 1850. The TEC module 1640 may include the TEC 1850 and power source 1806. The TEC 1850 may include a first thermally conductive element 1802 on a first end of the TEC 1850, and a second thermally conductive element 1804 on a second end of the TEC 1850. The TEC 1850 may include at least one n-type semiconductor 1852 and at least one p-type semiconductor 1854 that may be disposed between the first thermally conductive element 1802 and the second thermally conductive element 1804. The n-type and p-type semiconductors 1852, 1854 may be coupled in series by a number of conductive members. The illustrated embodiment shows first, second, and third conductive members 1856, 1858, 1860 that may be coupled to the n-type and p-type semiconductors 1852, 1854 in a manner similar to that describe above with regard to the first, second, and third conductive members 1756, 1758, 1760 that are coupled to the n-type semiconductor 1752 and the p-type semiconductor 1754.

In this case, the first and third conductive members 1856, 1860 may be electrically coupled to a power source 1806 such that an electrical current, at a given voltage, may be run through the semiconductors 1852, 1854. In operation, current may travel from a positive terminal of the power source 1806, through the third conductive member 1860, the n-type semiconductor 1852, the second conductive member 1858, the p-type semiconductor 1854, the first conductive member 1856, and to a negative terminal of the power source 1806. Accordingly, electrons in the n-type semiconductor 1852 may move toward the second thermally conductive element 1804, and positively charged "holes" in the p-type semiconductor 1854 may move toward the second thermally conductive element 1804. This charge motion may create a temperature gradient across each of the semiconductors 1852, 1854, with cooled ends corresponding to the direction charge motion of majority charge carriers for each of the semiconductors 1852, 1854. Therefore, current flowing through the TEC 1850 may cause the first thermally conductive element 1802 to cool, and may cause the second thermally conductive element 1804 to heat. Accordingly, the first thermally conductive element 1802 may be cooled to a temperature T18a, and the second thermally conductive element 1804 heated to a temperature T18b, where T18a<T18b. By adjusting the voltage and current, the temperature gradient across the semiconductors 1852, 1854 may be adjusted. Accordingly, the temperatures T18a, T18b of the first thermally conductive element 1802 and the second thermally conductive element 1804 may be adjusted.

In operation, the TEG module 1630 may generate electric power from the heat that dissipates from the heat source 1610, and at least a portion of the generated electric power may be supplied to the TEC module 1640. Accordingly, the TEC module 1640 may provide an active cooling for the cold member of the TEG module 1630. Therefore, the output power and/or efficiency of the waste heat recovery system may be increased.

Referring again to FIG. 16, in some implementations, the base block 1620 may include a heat exchanger 1650 disposed on a side that faces the heat source 1610. The heat exchanger 1650 may facilitate more efficient heat transfer between the heat source 1610 (e.g., kiln surface) and the base block 1620 via convective and radiative heat transfer. The heat exchanger 1650 may include (e.g., be made of) anodized aluminum, aluminum, aluminum alloys, copper, copper alloys, or the like. The material for the heat exchanger 1650 is not limited thereto, but may include other materials that generally have a high thermal conductivity, a high temperature operability, a corrosion resistance, and the like. In some implementations, a temperature sensor 1670 may be included to measure a temperature of a surface of the heat source 1610. The temperature sensor 1670 may be a thermocouple, a resistance temperature detector (RTD), an infrared sensor, or the like. When the temperature of the surface of the heat source 1610 is greater than a maximum operation temperature of the TEG, the electric load may be disconnected from the TEG to protect the TEG from being damaged by the high temperature. The waste heat recovery system 1600 may also include a heat sink 1660 disposed on the second end of the TEC module 1640. The heat sink 1660 may facilitate heat rejection from the hot surface of the TEC module 1640.

Figure 19:
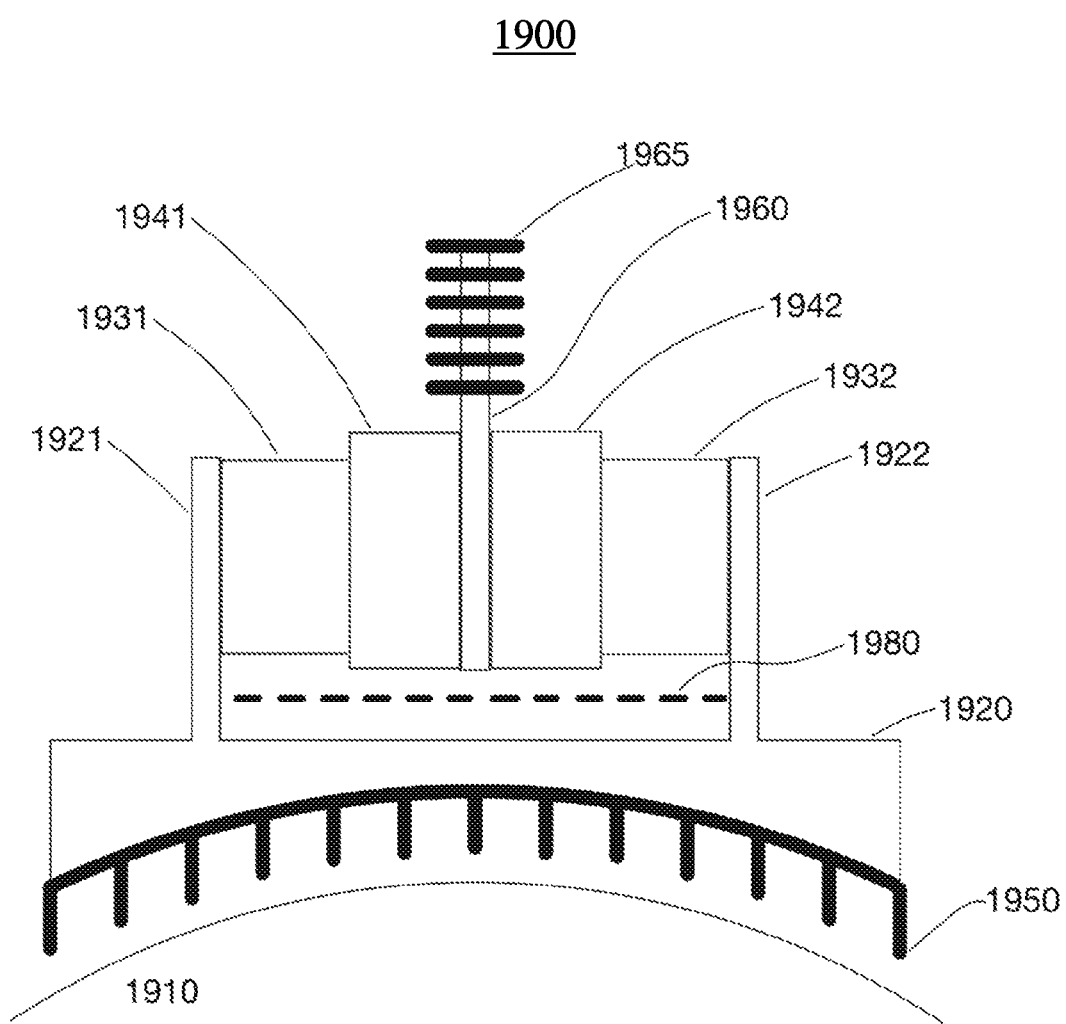
FIG. 19 is a cross-sectional diagram illustrating a waste heat recovery system according to another exemplary implementation of the present disclosure.

FIG. 19 is a cross-sectional diagram illustrating another exemplary implementation of a waste heat recovery system. As shown in FIG. 19, the waste heat recovery system may be implemented in a vertical arrangement. The waste heat recovery system 1900 may include a base block 1920, and the base block may include a first vertical fin 1921 and a second vertical fin 1922. A first TEG module 1931 may be disposed to be thermally coupled to the first vertical fin 1921, and a second TEG module 1932 may be disposed to be thermally coupled to the second vertical fin 1922. A first TEC module 1941 may be disposed to be thermally coupled to the first TEG module 1931, and a second TEC module 1942 may be disposed to be thermally coupled to the second TEG module 1932. The waste heat recovery system 1900 may also include a heat sink 1960 that is disposed between the first TEC module 1941 and the second TEC module 1942 and thermally coupled to both of the first TEC module 1941 and the second TEC module 1942. The heat sink 1960 may also include a plurality of heat dissipation fins 1965 to dissipate the heat more efficiently. The heat dissipation fins 1965 may be formed integrally with the heat sink 1960 or may be formed separately and thermally coupled to the heat sink 1960.

In some implementations, the base block 1920 may include a heat exchanger 1950 disposed on a side that faces the heat source 1910. The heat exchanger 1950 may facilitate more efficiency heat transfer between the heat source 1910 (e.g., kiln surface) and the base block 1920 via convective and radiative heat transfer. A bottom surface of the heat exchanger 1950 that faces the heat source 1910 may include a curved surface that substantially corresponds to a curvature of the cylindrical heat source to better surround the heat source. In some implementations, the waste heat recovery system 1900 may also include an insulator 1980 disposed between the base block 1920 and the TEG-TEC modules to thermally isolate the TEG-TEC modules from heat source 1910.

According to the exemplary implementation shown in FIG. 19, by being implemented in a vertical arrangement, the waste heat recovery system 1900 may pack more TEG-TEC pairs in a smaller footprint, recover a greater amount of heat from the heat source, and thereby increase the overall system efficiency.

In operation, the heat source (e.g., cement kiln) may sometimes require a cool-down for maintenance purposes, operational purposes, or due to a malfunction. When the heat source requires cooling, an electric power may be provided to the TEG such that the first end of the TEG is cooled and the second end of the TEG is heated. Accordingly, the surface of the heat source may receive an active cooling by the inverse operation of the TEG, and the heat source may be cooled more quickly.

In implementations, a plurality of the waste heat recovery apparatus may be disposed adjacent to (e.g., around; proximate to) the heat source (e.g., cement kiln) to surround the entire outer surface of the heat source to maximize the portion of the scavenged heat. Cement kilns may provide a thermal input to the base block and maintain the temperature of the TEG hot member temperature at about 350° C. The TEC module may maintain the TEG cold member temperature at about 30° C. However, the operation temperatures of the system is not limited thereto and may vary based on the amount of heat dissipation from the heat source, ambient conditions, or the like.

Figure 20A:
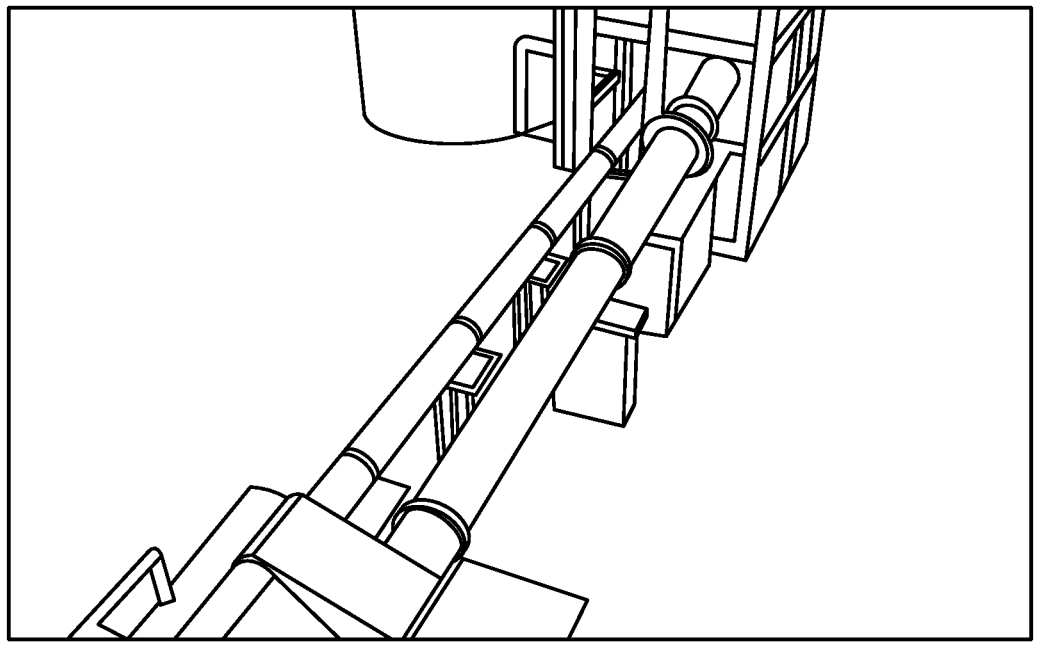
FIGS. 20A to 20D illustrate examples of a waste heat recovery system installed around a cement kiln.
Figure 20B:
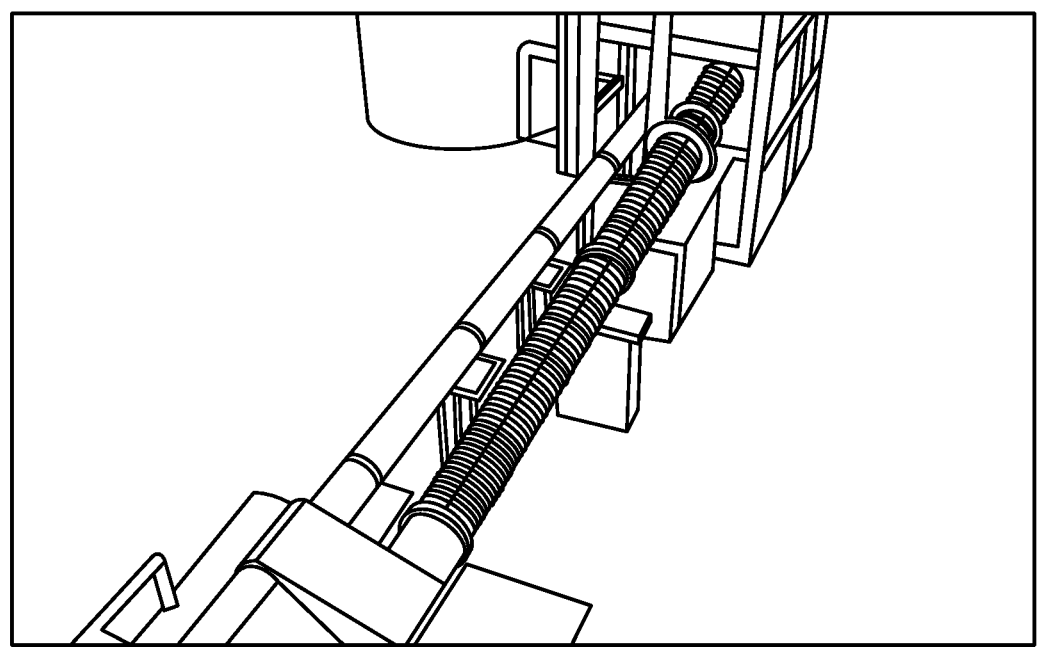
Figure 20C:
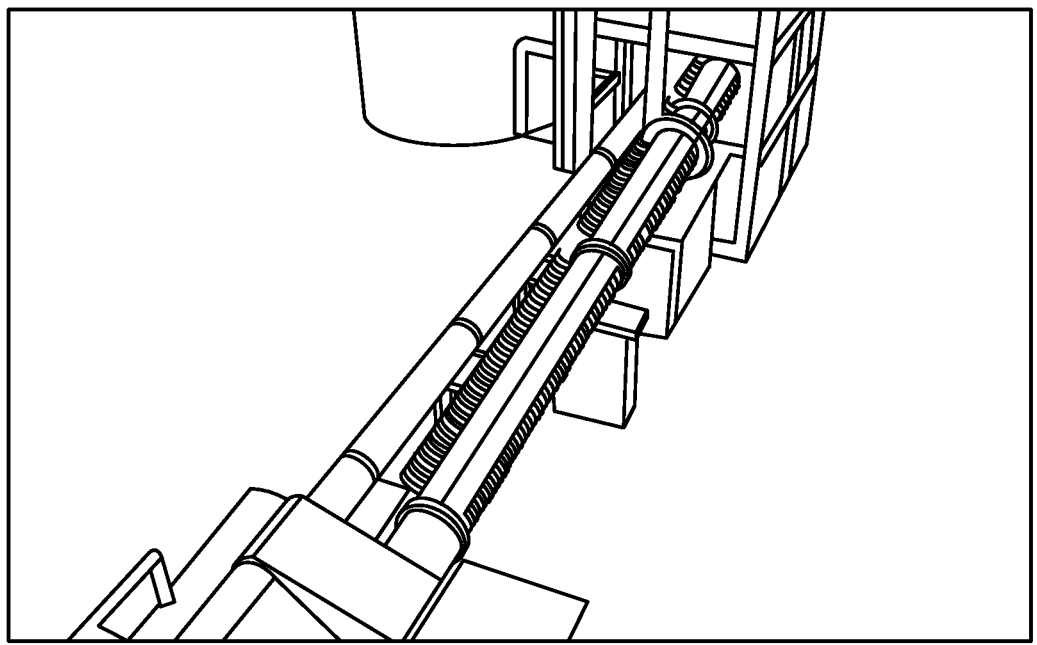

FIGS. 20A to 20D illustrate examples of the electric power generation system installed around a cement kiln. FIG. 20A illustrates an example of a cement kiln with no electric power generation system installed. FIG. 20B illustrates an example of a cement kiln with an exemplary implementation of an electric power generation system installed around the kiln. FIG. 20C illustrates the electric power generation system open for demonstration purposes.

Figure 20D:
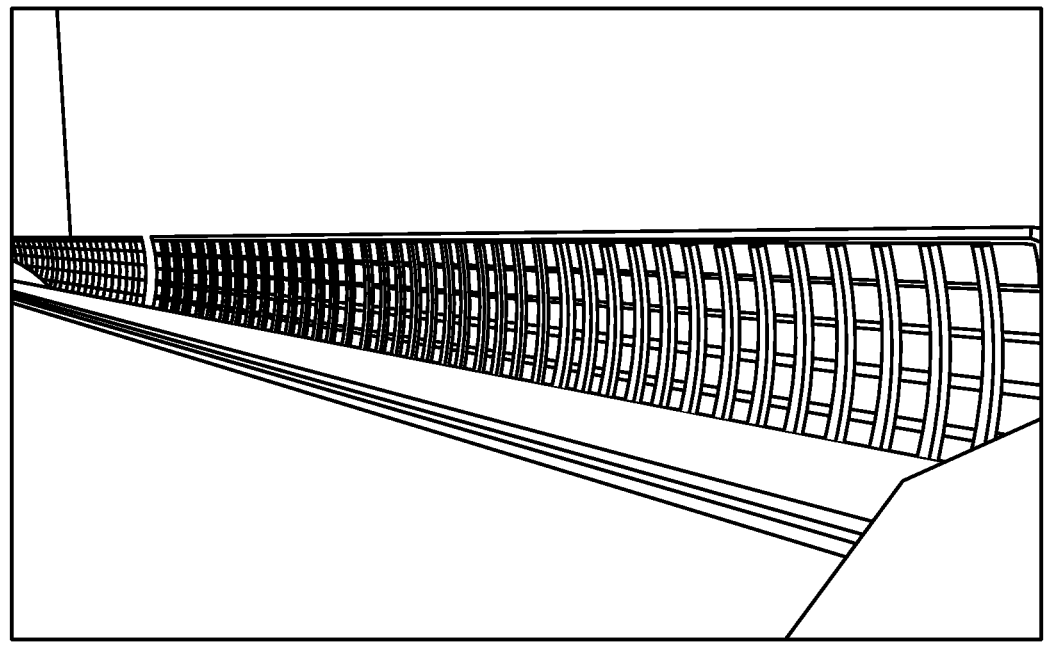

FIG. 20D illustrates an inner side configuration of the electric power generation system viewed from the base block 200 side.

Figure 21:
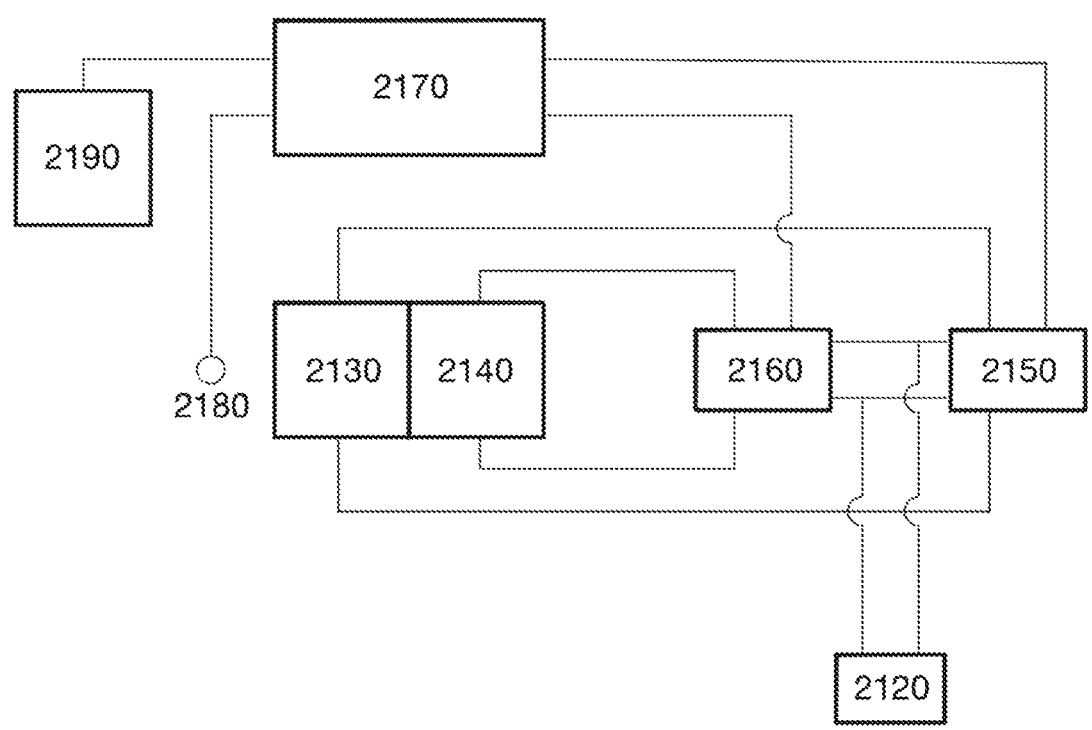
FIG. 21 is a diagram illustrating signal flows and electrical power flows according to an exemplary implementation of the present disclosure.

FIG. 21 is a diagram illustrating electrical connections according to an exemplary implementation of the present disclosure. As shown in FIG. 21, the electricity generated by a TEG 2130 may be collected at a TEG driver 2150, and a portion of the input power may be supplied to a TEC driver 2160. The TEC driver 2160 may supply electrical power to a TEC 2140 based on a TEC control signal generated by a controller 2170. The TEG driver 2150 may supply power output to an external load 2120, thereby achieving a net power generation.

The controller 2170 may receive data from environmental sensors 2190, and generate control signals based on the environmental data. The environmental data may include ambient temperature, ambient humidity, wind speed, wind direction, precipitation data, or the like. The controller 2170 may also receive a kiln surface temperature data from a temperature sensor 2180. When the temperature data is above a first preset temperature, the controller 2170 may deliver a control signal to the TEG driver 2150 to cause the TEG driver to electrically disconnect the TEG 2130 and stop extracting power from the TEG 2130. When the temperature data is above a second preset temperature, the controller 2170 may deliver a control signal to the TEG driver 2150 to cause the TEG driver to supply electricity to the TEG 2130 such that the TEG 2130 operates in a cooling mode and is used to cool the kiln surface. The second preset temperature may be greater than the first preset temperature. In some implementations, the second preset temperature may be less than the first preset temperature.

Figure 22:
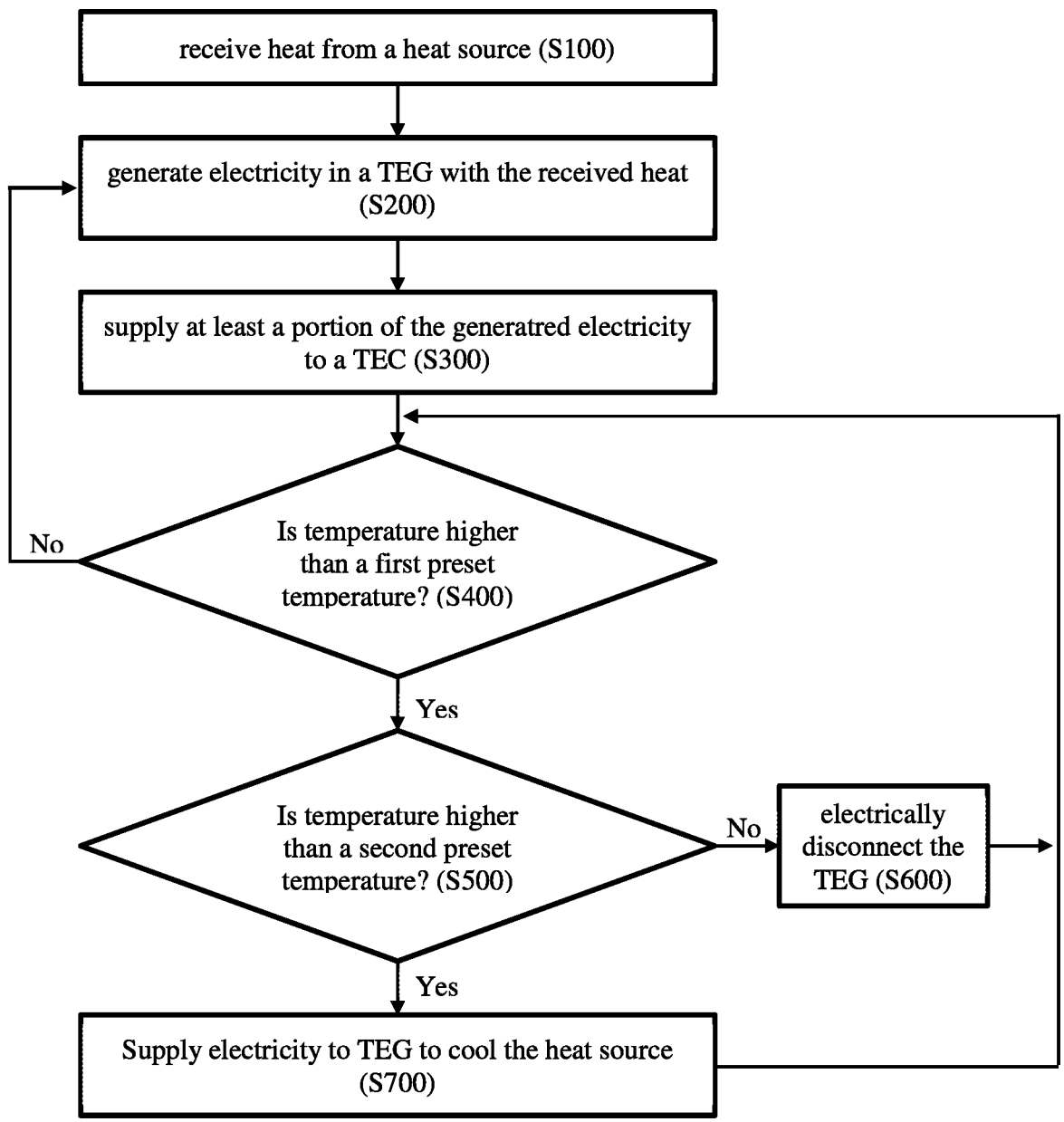
FIG. 22 is a flow chart illustrating a method of controlling a waste heat recover system.

FIG. 22 is a flow chart illustrating a method of controlling modes of operating a waste heat recover system according to an exemplary implementation of the present disclosure. In step S100, the waste heat recover system may receive heat from a heat source. In step S200, electricity may be generated in a TEG using the received heat. In step S300, a portion of the generated electricity may be supplied to a TEC to cause the TEC to cool the cold member of the TEG. Steps S100, S200, and S300 may be referred to as a power generation mode. In step S400, a temperature of the heat source may be monitored. When the measured temperature is lower than a first preset temperature, the cycle may be repeated and the system may maintain the power generation mode. When the measure temperature is greater than or equal to the first preset temperature, the controller may subsequently evaluate whether the temperature is higher than a second preset temperature (S500). When the measured temperature is less than the second preset temperature, the controller may cause to electrically disconnect the TEG such that no power is generated from the TEG (S600). When the measured temperature is greater than or equal to the second preset temperature, the controller may activate a cooling mode, in which the controller may cause to supply electricity to the TEG to operate it such that the TEG cools the surface of the heat source (S700). The temperature monitoring loop (S400, S500, S600, and S700) may be repeated until the measured temperature becomes less than the first preset temperature, in which case the controller may cause the waste heat recovery system to operate in the power generation mode. Alarms may be generated when detecting that the measured temperature is higher than the first preset temperature or the second preset temperature. The alarms may be visible and/or audible, and are not limited to any particular means. Any alarms known in the art may be used.

Exemplary technical effects of the subject matter described herein include the ability to scavenge and convert waste heat into electrical power, thereby increasing the overall energy utilization, for example, for cement manufacturing processes. Although a few variations have been described in detail above, other modifications or additions are possible. For example, the subject matter described herein is not limited to application within cement kilns, and may be applied within any system to scavenge and recuperate waste heat.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including acoustic, speech, or tactile input. Other possible input devices include touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An apparatus comprising:
   first, second, and third thermally conductive members;
   a body configured to receive heat from a fluid;
   at least one thermoelectric generator (TEG) positioned between the first thermally conductive member and the body, having a first end and a second end, the first end of the at least one TEG being thermally coupled to the body and configured to receive at least a portion of the heat from the fluid, and the second end of the at least one TEG being thermally coupled to the first thermally conductive member and configured to deliver heat to the first thermally conductive member;
   a first thermoelectric cooler (TEC) having a first end and a second end, the second end of the at least one TEC being thermally coupled to the first thermally conductive member, and the first end of the at least one TEC being thermally coupled to the second thermally conductive member, the at least one TEC being configured to receive electric power, which causes the first end of the at least one TEC to heat to deliver heat to the second thermally conductive member, and the second end of the at least one TEC to cool such that the second end of the at least one TEC extracts heat from the first thermally conductive member;
   a second TEC positioned between, and coupled to, the second and third thermally conductive members, the second TEC being configured to remove heat from the third thermally conductive member, and to deliver heat to the second thermally conductive member, and
   at least one temperature sensor embedded within the body.

2. The apparatus of claim 1, wherein the at least one temperature sensor is positioned adjacent to one of the first end and the second end of the at least one TEG, the at least one temperature sensor being configured to measure a temperature of condenser at the position adjacent to one of the first end and the second end of the at least one TEG.

3. The apparatus of claim 1, wherein the at least one temperature sensor is positioned adjacent to one of the first end and the second end of the at least one TEC, and configured to measure a temperature of condenser at the position adjacent to one of the first end and the second end of the first TEC.

4. An apparatus comprising:
   first, second, and third thermally conductive members;
   a first thermoelectric cooler (TEC) positioned between, and coupled to, the first and second thermally conductive members, the first TEC being configured to remove heat from the first thermally conductive member, and to deliver heat to the second thermally conductive member;
   a second TEC positioned between, and coupled to, the second and third thermally conductive members, the second TEC being configured to remove heat from the third thermally conductive member, and to deliver heat to the second thermally conductive member;
   a first body having a first passage extending therethrough, the first passage being configured to receive a fluid, and the first body being configured to receive heat from the fluid
   a second body having a second passage extending therethrough, the second passage being configured to receive the fluid from the first passage, and the body being configured to receive heat from the fluid;
   a first thermoelectric generator (TEG) positioned between the first thermally conductive member and the first body, the first TEG being configured to receive heat transferred to the first body from the fluid; and
   a second TEG positioned between the third thermally conductive member and the second body, the second TEG being configured to receive heat transferred to the second body from the fluid.

5. A method comprising:
   delivering a fluid to a body of a heat exchanger;
   transferring heat from the fluid to the body;
   transferring heat from the body to a first end of a thermoelectric generator (TEG);
   delivering a first electric power to a first thermoelectric cooler (TEC) having a first end and a second end, the second end of the first TEC being thermally coupled to a first thermally conductive member, and the first end of the first TEC being thermally coupled to a second thermally conductive member, thereby causing the first end of the first TEC to increase in temperature to deliver heat to the second thermally conductive member, and the second end of the first TEC to decrease in temperature to extract heat from the first thermally conductive member;

delivering a second electric power to a second thermoelectric cooler (TEC) having a first end and a second end, the second end of the second TEC being thermally coupled to a third thermally conductive member, and the first end of the second TEC being thermally coupled to the second thermally conductive member, thereby causing the first end of the second TEC to increase in temperature to deliver heat to the second thermally conductive member and the second end of the second TEC to decrease in temperature to extract heat from the third thermally conductive member;

transferring heat from a second end of the TEG to the first thermally conductive member;

creating a temperature gradient across semiconductors of the TEG, thereby causing the TEG to generate a second electric power; and measuring a temperature of the heat exchanger at a location adjacent to at least one of the first and second ends of the TEG, and adjusting at least one of a voltage and a current of the first electric power delivered to the first TEC based on the measured temperature.

6. The method of claim 5, further comprising delivering at least portion of the second electric power to the first TEC.

7. The method of claim 5, further comprising storing at least a portion of the second electric power within batteries.

8. The method of claim 5, further comprising measuring a temperature of the heat exchanger at a location adjacent to at least one of the first and second ends of the first TEC, and adjusting at least one of a voltage and a current of the first electric power delivered to the first TEC based on the measure temperature.

9. The method of claim 5, further comprising delivering at least a portion of the second electric power to a compressor that compresses the fluid.

10. An apparatus comprising:
a base block disposed adjacent to a heat source;
a temperature sensor embedded within the base block and configured to measure a temperature of a surface of the heat source;
first, second, and third thermally conductive members;
a thermoelectric generator (TEG) positioned between the first thermally conductive member and the body, and including a first end and a second end, the first end being thermally coupled to the base block and configured to receive heat from the heat source, and the second end of the TEG being thermally coupled to the first thermally conductive member and configured to deliver heat to the first thermally conductive member;

a first thermoelectric cooler (TEC) positioned between the first and second thermally conductive members, and including a third end and a fourth end, the third end being thermally coupled to the first thermally conductive member, the first thermoelectric cooler being configured to receive an electric current, which causes the third end to cool and the fourth end to heat such that the third end conducts heat from the first thermally conductive member; and a second thermoelectric cooler (TEC) positioned between, and coupled to, the second and third thermally conductive members, the second TEC being configured to remove heat from the third thermally conductive member and to deliver heat to the second thermally conductive member.

11. The apparatus of claim 10, wherein the thermoelectric generator is configured to generate electrical power and at least a portion of the generated electrical power is supplied to the first thermoelectric cooler for cooling.

12. The apparatus of claim 10, wherein the heat source includes a kiln.

13. The apparatus of claim 10, wherein the base block includes a heat exchanger on a side that faces the heat source.

14. The apparatus of claim 10 comprising a heat sink disposed on the fourth end.

15. The apparatus of claim 10, wherein the temperature sensor is a thermocouple, a resistance temperature detector (RTD), or an infrared sensor.

16. The apparatus of claim 10, wherein, in response to detecting that the temperature of the surface of the heat source is greater than a predetermined temperature limit, an electric current is provided to the thermoelectric generator such that the first end is cooled and the second end is heated.

\* \* \* \* \*